United States Patent
Gosselin et al.

(10) Patent No.: US 10,238,008 B2
(45) Date of Patent: Mar. 19, 2019

(54) CONTAINMENT SYSTEMS AND RELATED METHODS OF USE

(71) Applicant: Ortronics, Inc., New London, CT (US)

(72) Inventors: Daniel P. Gosselin, Harrisville, RI (US); Michael D. Quaglia, Waterford, CT (US); Chris Vacca, Westerly, RI (US); Todd P. Schneider, Monroe, CT (US); Manny D. Linhares, Coventry, RI (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 15/369,466

(22) Filed: Dec. 5, 2016

(65) Prior Publication Data

US 2018/0132385 A1    May 10, 2018

Related U.S. Application Data

(60) Provisional application No. 62/419,281, filed on Nov. 8, 2016.

(51) Int. Cl.
*H05K 7/20* (2006.01)

(52) U.S. Cl.
CPC .............................. *H05K 7/20745* (2013.01)

(58) Field of Classification Search
CPC ........... H05K 7/20745; H05K 7/20709; H05K 7/1488; H05K 7/1497; E04B 2/7457; E04B 1/19; E04B 2/7425
USPC ......... 52/281, 282.1, 282.2, 474, 648.1, 780
See application file for complete search history.

(56) References Cited

U.S. PATENT DOCUMENTS

| | | | |
|---|---|---|---|
| 3,566,561 A * | 3/1971 | Tozer | A47B 96/1466 52/127.12 |
| 3,820,299 A * | 6/1974 | Verholt | A47B 96/1466 52/282.2 |
| 5,413,836 A * | 5/1995 | Hsieh | F16B 37/046 428/122 |
| 5,647,181 A * | 7/1997 | Hunts | A63H 33/10 312/111 |
| 6,672,955 B2 | 1/2004 | Charron | |
| 6,802,171 B2 * | 10/2004 | McKinnon | A47B 47/03 411/84 |
| 6,859,366 B2 | 2/2005 | Fink | |
| 6,980,433 B2 | 12/2005 | Fink | |

(Continued)

*Primary Examiner* — Brian E Glessner
*Assistant Examiner* — Adam G Barlow
(74) *Attorney, Agent, or Firm* — McCarter & English, LLP

(57) ABSTRACT

The present disclosure provides advantageous containment systems configured to be deployed in a data center, and improved methods/systems for using the same. The present disclosure provides light-weight, user-friendly and modular containment systems configured to be adjustably deployed in a horizontal or vertical orientation on the hot or cold aisle in a data center. The containment systems of the present disclosure can be deployed in a horizontal and/or vertical application and can be used on the cold or hot aisle. The containment systems of the present disclosure can be: (i) mounted to cabinets through bracketry; (ii) suspended overhead from the building infrastructure via threaded rod or the like; (iii) supported by overhead pathways (e.g., attached or mounted to cable/wire baskets, cable ladders, troughs, etc.); and/or (iv) secured from the floor (e.g., via post-like objects or structures or the like).

18 Claims, 18 Drawing Sheets

(56) References Cited

U.S. PATENT DOCUMENTS

| | | | |
|---|---|---|---|
| 7,046,514 B2 | 5/2006 | Fink et al. | |
| 7,096,637 B2 * | 8/2006 | McMillan | G09F 15/0068 |
| | | | 52/653.1 |
| 7,145,772 B2 | 12/2006 | Fink | |
| 7,173,820 B2 | 2/2007 | Fink et al. | |
| 7,430,118 B1 * | 9/2008 | Noteboom | H05K 7/20745 |
| | | | 361/695 |
| 7,529,086 B2 | 5/2009 | Fink et al. | |
| 7,672,128 B2 | 3/2010 | Noteboom et al. | |
| 7,684,193 B2 | 3/2010 | Fink et al. | |
| 7,800,900 B1 * | 9/2010 | Noteboom | H05K 7/20745 |
| | | | 361/679.47 |
| 7,841,199 B2 | 11/2010 | VanGilder et al. | |
| 7,881,057 B2 | 2/2011 | Fink et al. | |
| 8,356,446 B2 * | 1/2013 | Takeda | A47C 29/003 |
| | | | 52/762 |
| 8,523,643 B1 * | 9/2013 | Roy | G06F 1/20 |
| | | | 454/184 |
| 8,713,869 B1 * | 5/2014 | Eychaner | H05K 7/20745 |
| | | | 52/238.1 |
| 9,072,200 B2 | 6/2015 | Dersch et al. | |
| 9,572,286 B2 * | 2/2017 | Greeson | H05K 7/1497 |
| 2008/0305733 A1 | 12/2008 | Noteboom et al. | |
| 2009/0107652 A1 | 4/2009 | VanGilder et al. | |
| 2009/0277605 A1 | 11/2009 | VanGilder et al. | |
| 2010/0061057 A1 | 3/2010 | Dersch | |
| 2010/0091448 A1 | 4/2010 | Noteboom et al. | |
| 2010/0188816 A1 * | 7/2010 | Bean, Jr. | H05K 7/20745 |
| | | | 361/696 |
| 2010/0300648 A1 | 12/2010 | Grantham | |
| 2010/0307716 A1 * | 12/2010 | Bean, Jr. | H05K 7/20745 |
| | | | 165/80.2 |
| 2010/0315775 A1 * | 12/2010 | Grantham | H05K 7/20745 |
| | | | 361/688 |
| 2011/0108207 A1 * | 5/2011 | Mainers | H05K 7/20745 |
| | | | 160/87 |
| 2013/0300266 A1 * | 11/2013 | Ramey | A47B 87/0276 |
| | | | 312/111 |
| 2014/0196394 A1 * | 7/2014 | Greeson | H05K 7/1497 |
| | | | 52/404.2 |
| 2015/0259938 A1 * | 9/2015 | Bernard | E04H 1/005 |
| | | | 52/64 |
| 2017/0121966 A1 * | 5/2017 | Jiang | E04B 1/947 |
| 2017/0127568 A1 * | 5/2017 | Rimler | F16L 3/26 |
| 2017/0127569 A1 * | 5/2017 | Rimler | F24F 13/0227 |
| 2017/0150652 A1 * | 5/2017 | Greeson | H05K 7/1497 |
| 2017/0231107 A1 * | 8/2017 | Bernard | H05K 7/1497 |

\* cited by examiner

CONTAINMENT SYSTEMS AND RELATED METHODS OF USE

CROSS-REFERENCE TO RELATED APPLICATIONS

This application claims the benefit of U.S. Provisional Application entitled "CONTAINMENT SYSTEMS AND RELATED METHODS OF USE," which was filed on Nov. 8, 2016, and assigned Ser. No. 62/419,281, the contents of which are herein incorporated by reference in their entirety.

FIELD OF THE DISCLOSURE

The present disclosure relates to containment systems configured to be deployed in a data center, more particularly to the design and use of light-weight, user-friendly and modular containment systems configured to be adjustably deployed in a horizontal or vertical orientation on the hot or cold aisle in a data center.

BACKGROUND OF THE DISCLOSURE

In general, containment systems can be deployed in a data center or the like to increase energy efficiency and reliability (e.g., via aisle containment in a data center). Some containment systems include the practice of constructing horizontal ceilings or vertical walls above a row of cabinets in a data center. A containment system can be deployed with doors at the end of the row of cabinets, but sometimes the containment systems are deployed independently.

In general, a containment system creates an airflow barrier that mitigates recirculation and bypass airflow. Separating the hot air from the cold air creates energy savings by allowing the cooling system to operate more efficiently. A containment system can also provide a consistent air inlet temperature, which increases reliability of the equipment housed in the data center cabinets. Some benefits of a containment system can be amplified when following improved practices such as deploying bottom panels, air dams, blanking panels and seal kits on the cabinets (e.g., improved air hygiene).

Containment systems can be deployed in many applications. For example, containment systems can be deployed on a raised or slab floor. Vertical containment can be installed tangent to the ceiling filled with egg crate returns and the hot air can be vented to a common plenum. Vertical containment can also be used in a stratification application where the hot air is exhausted towards a high ceiling at a maximum height possible.

Overhead air handlers can be used to drop cold air into a cold aisle using vertical containment. While many containment installations in the U.S. are hot aisle containment systems, some users prefer cold aisle containment systems. Some data centers deploy both hot and cold aisle containment systems for a closed loop system, while others deploy cold aisle containment systems and chimneys on the cabinets to create a closed loop cooling system. Cold or hot aisle containment systems can also be deployed in conjunction with in-row coolers, overhead cooling units or rear door heat exchangers.

Some exemplary assemblies/systems in this general field are described and disclosed in U.S. Pat. Nos. 7,046,514 and 7,841,199, and 9,072,200, the entire contents of each being hereby incorporated by reference in their entireties.

An interest exists for improved containment systems and related components, and related methods of use. These and other inefficiencies and opportunities for improvement are addressed and/or overcome by the systems, assemblies and methods of the present disclosure.

SUMMARY OF THE DISCLOSURE

The present disclosure provides advantageous containment systems configured to be deployed in a data center, and improved methods/systems for using the same. The present disclosure provides light-weight, user-friendly and modular containment systems configured to be adjustably deployed in a horizontal or vertical orientation on the hot or cold aisle in a data center.

The present disclosure provides for a containment system including a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall; wherein at least a first portion of the first, second and third walls define a first channel of the first rail member; wherein at least a second portion of the first, second and third walls define a second channel of the first rail member; wherein at least a portion of the second, fourth and fifth walls define a third channel of the first rail member; and wherein at least a portion of the third, sixth and seventh walls define a fourth channel of the first rail member; wherein the first rail member is configured to be mounted proximal to a first supporting structure of a data center; and wherein the first, second, third and fourth channels of the first rail member are each individually configured to releasably house a portion of a respective panel member, each individually housed panel member configured to extend from the first rail member.

The present disclosure also provides for a containment system wherein the first supporting structure is a cabinet or equipment rack. The present disclosure also provides for a containment system wherein the fifth wall includes a first extension wall, and a first passage is defined between the second wall and the first extension wall; wherein the seventh wall includes a second extension wall, and a second passage is defined between the third wall and the second extension wall; and wherein the first rail member is mounted with respect to the first supporting structure via a cabinet bracket, the cabinet bracket mounted to the first supporting structure and mounted to the first and second passages of the first rail member.

The present disclosure also provides for a containment system wherein the fifth wall includes a first extension wall, the first extension wall defining a first recess; wherein the seventh wall includes a second extension wall, the second extension wall defining a second recess; and wherein the first rail member is mounted proximal to the first supporting structure via a hanger bracket, the hanger bracket mounted to a support member and mounted to the first and second recesses of the first rail member.

The present disclosure also provides for a containment system wherein the first supporting structure is aligned in a first row of supporting structures. The present disclosure also provides for a containment system wherein the first, second, third and fourth channels each define a substantially U-shaped or C-shaped channel.

The present disclosure also provides for a containment system further including a second rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall; wherein at least a first portion of the first, second and third walls define a first channel of the second rail member; wherein at least a second portion of the first, second and third walls define a second channel of the second rail member; wherein at least a portion of the second, fourth and fifth walls define a third channel of the second rail member; and wherein at least a portion of the third, sixth and seventh walls define a fourth channel of the second rail member; and wherein the first, second, third and fourth channels of the second rail member are each individually configured to releasably house a portion of a respective panel member.

The present disclosure also provides for a containment system wherein the second rail member is configured to be mounted proximal to a second supporting structure of the data center; and further including a first panel member housed in the second channel of the first rail member and housed in the first channel of the second rail member, the first panel member extending horizontally from the first rail member to the second rail member.

The present disclosure also provides for a containment system wherein the second supporting structure is aligned in a second row of supporting structures. The present disclosure also provides for a containment system further including a first panel member housed in the third channel of the first rail member and housed in the fourth channel of the second rail member, the first panel member extending vertically from the first rail member to the second rail member.

The present disclosure also provides for a containment system further including a second panel member housed in the second channel of the first rail member and housed in the first channel of the second rail member, the second panel member extending horizontally from the first rail member to the second rail member, with the first panel member connected to the second panel member via a panel joiner.

The present disclosure also provides for a containment system wherein the second rail member is transversely mounted to the first rail member via an angled splice member, a first portion of the angled splice member positioned in the second channel of the first rail member, and a second portion of the angled splice member positioned in the first channel of the second rail member.

The present disclosure also provides for a containment system further including a corner splice member mounted to the first and second rail members, a first portion of the corner splice member positioned in the first channel of the first rail member, and a second portion of the corner splice member positioned in the second channel of the second rail member.

The present disclosure also provides for a containment system wherein the second rail member is linearly mounted to the first rail member via a splice member, a first portion of the splice member positioned in the first channel of the first rail member, and a second portion of the splice member positioned in the first channel of the second rail member.

The present disclosure also provides for a containment system further including a cabinet seal or a bulb seal mounted with respect to the fourth channel of the first rail member, the cabinet or bulb seal extending from the fourth channel to the first supporting structure.

The present disclosure also provides for a containment system wherein the first panel member is mounted in the second channel of the first rail member via a first plurality of clip members, and the first panel member is mounted in the first channel of the second rail member via a second plurality of clip members.

The present disclosure also provides for a containment system wherein the first channel of the first rail member includes a first groove and a second groove; wherein the first portion of the splice member includes a first protruding section and a second protruding section; and wherein the splice member is mounted to the first channel of the first rail member via the first protruding section positioned in the first groove and the second protruding section positioned in the second groove.

The present disclosure also provides for a containment system wherein the splice member includes a base wall, a first arm wall and a second arm wall, the base wall and first and second arm walls defining a substantially U-shaped or C-shaped splice member.

The present disclosure also provides for a containment system including a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the first rail member, and at least a second portion of the first, second and third walls defining a second channel of the first rail member, and at least a portion of the second, fourth and fifth walls defining a third channel of the first rail member, and at least a portion of the third, sixth and seventh walls defining a fourth channel of the first rail member, with the first, second, third and fourth channels of the first rail member each individually configured to releasably house a portion of a respective panel member; a second rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the second rail member, and at least a second portion of the first, second and third walls defining a second channel of the second rail member, and at least a portion of the second, fourth and fifth walls defining a third channel of the second rail member, and at least a portion of the third, sixth and seventh walls defining a fourth channel of the second rail member, with the first, second, third and fourth channels of the second rail member each individually configured to releasably house a portion of a respective panel member; a first supporting structure of a data center, the first rail member configured to be mounted proximal to the first supporting structure of the data center; a second supporting structure of the data center, the second rail member configured to be mounted proximal to the second supporting structure of the data center; and a first panel member housed in the second channel of the first rail member and housed in the first channel of the second rail member, the first panel member extending horizontally from the first rail member to the second rail member; wherein the first supporting structure is aligned in a first row of supporting structures; and wherein the second supporting structure is aligned in a second row of supporting structures.

The present disclosure also provides for a containment system including a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the first rail member, and at least a second portion of the first, second and third walls defining a second channel of the first rail member, and at least a portion of the second, fourth and fifth walls defining a third channel of the first rail member, and at least a portion of the third, sixth and seventh walls defining a fourth channel of the first rail member, with the first, second, third and fourth channels of the first rail member each individually configured to releasably house a portion of a respective panel member; a second rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the second rail member, and at least a second portion of the first, second and third walls defining a second channel of the second rail member, and at least a portion of the second, fourth and fifth walls defining a third channel of the second rail member, and at least a portion of the third, sixth and seventh walls defining a fourth channel of the second rail member, with the first, second, third and fourth channels of the second rail member each individually configured to releasably house a portion of a respective panel member; a first supporting structure of a data center, the first rail member configured to be mounted proximal to the first supporting structure of the data center; a first panel member housed in the third channel of the first rail member and housed in the fourth channel of the second rail member, the first panel member extending vertically from the first rail member to the second rail member; and a cabinet seal or a bulb seal mounted with respect to the fourth channel of the first rail member, the cabinet or bulb seal extending from the fourth channel to the first supporting structure.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure. To assist those of ordinary skill in the art in making and using the disclosed assemblies, systems and methods, reference is made to the appended figures, wherein.

DETAILED DESCRIPTION OF DISCLOSURE

Figure 1:
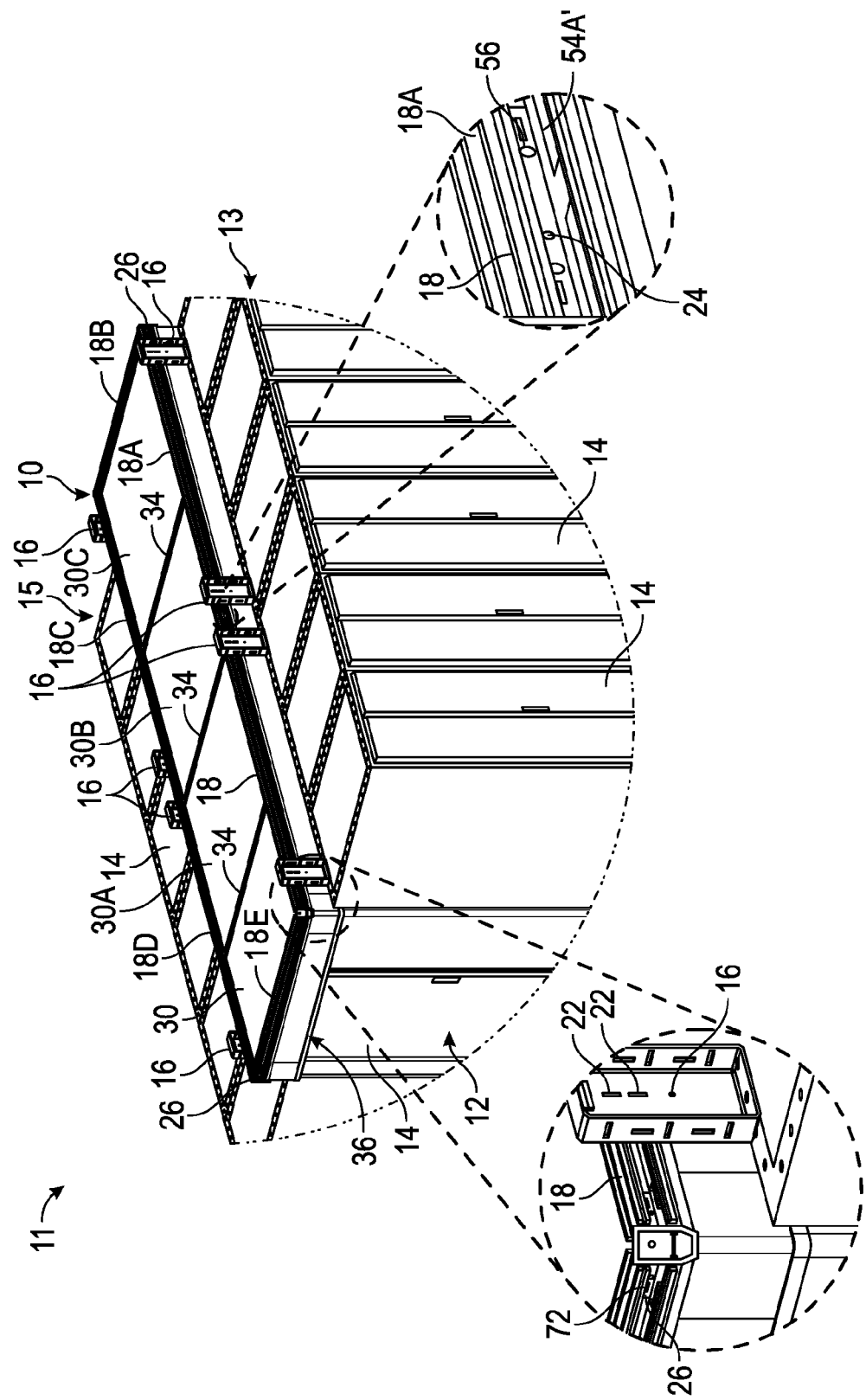
FIG. 1 is a side perspective view of an exemplary containment system of the present disclosure.

The exemplary embodiments disclosed herein are illustrative of advantageous containment systems, and assemblies of the present disclosure and methods/techniques thereof. It should be understood, however, that the disclosed embodiments are merely exemplary of the present disclosure, which may be embodied in various forms. Therefore, details disclosed herein with reference to exemplary containment systems and associated processes/techniques of assembly and use are not to be interpreted as limiting, but merely as the basis for teaching one skilled in the art how to make and use the advantageous containment systems and/or alternative systems of the present disclosure.

In general, the present disclosure provides improved containment systems, and related methods of use. The present disclosure provides improved containment systems configured to be deployed in a data center, and improved methods/systems for using the same. More particularly, the present disclosure provides light-weight, user-friendly and modular containment systems configured to be adjustably deployed in a horizontal or vertical orientation on the hot or cold aisle in a data center.

The exemplary containment systems of the present disclosure can be deployed in a horizontal or vertical application and can be used on the cold or hot aisle.

Exemplary overhead containment systems of the present disclosure can be secured and/or mounted via a variety of mounting systems/methods. For example, the containment systems of the present disclosure can be: (i) mounted to a cabinet through bracketry; (ii) suspended overhead from the building infrastructure via threaded rod or the like; (iii) supported by overhead pathways (e.g., attached or mounted to cable/wire baskets, cable ladders, troughs, etc.); and/or (iv) secured from the floor (e.g., via a post-like object or structure or the like).

In exemplary embodiments, the advantageous containment system provides a mass customization strategy where the part offerings are wide and varied enough allowing the system to meet many user-defined applications.

The containment system can be provided in kits to fit specific aisle sizes in the horizontal and/or vertical orientation. The related components of the containments system can be cut to fit if the aisle is shorter than the kit. The sub-components can also be provided separately and utilized as needed (e.g., to create systems/assemblies to fill gaps in the aisle, contain around building support columns, adjust to a "city-scape" type aisle where the top of the row is crenellated by varying height cabinets).

The components of the exemplary containment system can be assembled on site to create horizontal or vertical containment systems. The components can be provided as kits for certain aisle sizes and can be provided as individual pieces so that systems/assemblies can be created on site to overcome obstacles and adapt to obstructions, etc.

Referring now to the drawings, like parts are marked throughout the specification and drawings with the same reference numerals, respectively. Drawing figures are not necessarily to scale and in certain views, parts may have been exaggerated for purposes of clarity.

With reference to FIG. 1, there is illustrated an embodiment of an exemplary containment system 10 according to the present disclosure.

In general, containment system 10 is configured and dimensioned to be adjustably deployed in a horizontal or vertical orientation on the hot or cold aisle 12 in a data center 11, the data center 11 including a first row 13 of cabinets 14 and a second row 15 of cabinets. FIG. 1 depicts containment system 10 deployed in the horizontal orientation (e.g., cabinet 14 supported).

It is noted that exemplary containment system 10 is adapted for use in conjunction with cabinets 14 or the like, although the present disclosure is not limited thereto. Rather, the disclosed containment systems 10 are adapted for use in conjunction with other structures, such as, for example, frames, racks, patch panels, enclosures, supporting structures, or other structures that stand to benefit from aisle containment. For ease of disclosure, the potential structures to which the disclosed containment systems may be detachably mounted relative to are collective referred to as "cabinets." However, it is to be understood that the present disclosure is not limited by or to implementations wherein the disclosed containment systems 10 are mounted with respect to, or used in conjunction with cabinets, but may be mounted with respect to, or used in conjunction with any structure/unit that is in proximity to or otherwise associated with aisle containment.

As shown in FIG. 1, a plurality of cabinet brackets 16 are mounted to the top of a plurality of different cabinets 14.

Each cabinet bracket 16 can then be mounted to a respective rail member 18 (or 18A, 18B, 18C, 18D, 18E). As shown in FIG. 1, system 10 includes rail members 18, 18A, 18B, 18C, 18D and 18E, with rail members 18, 18A, 18C and 18D each mounted to two separate cabinet brackets 16.

Figure 3:
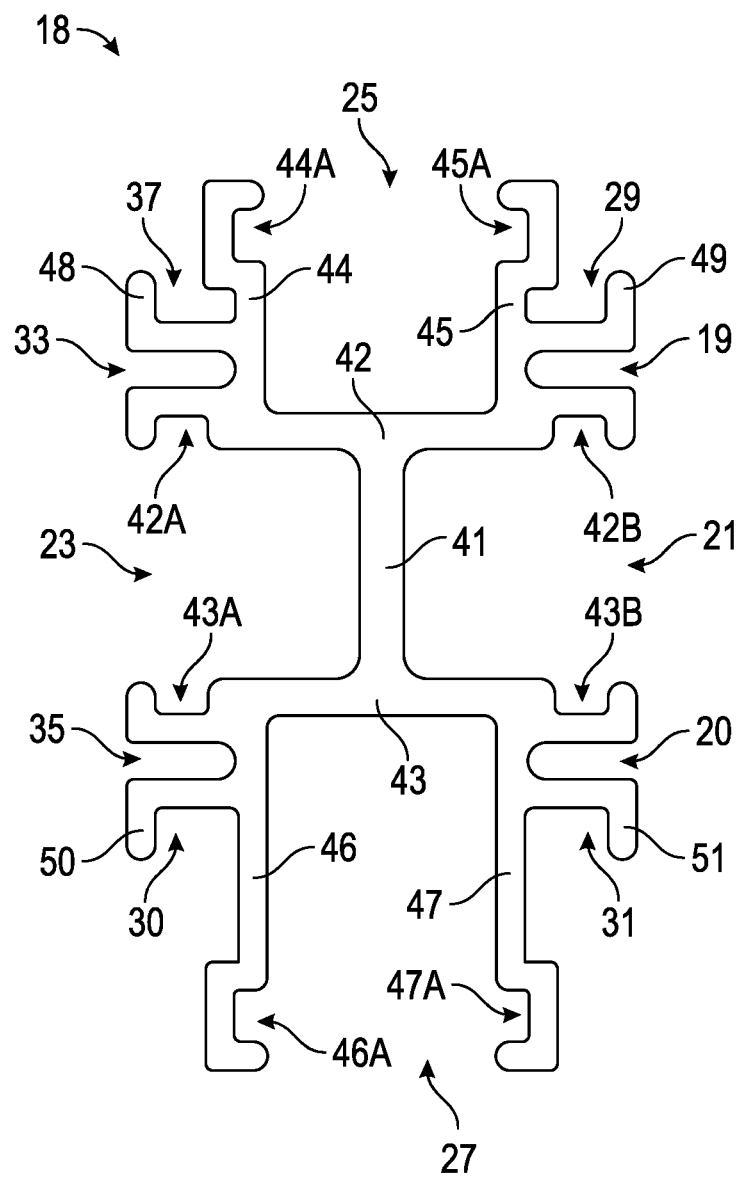
FIG. 3 is an end view of an exemplary rail member of a containment system of the present disclosure

As shown in FIGS. 1 and 3, each cabinet bracket 16 can be mounted to a respective rail member 18 (or 18A, etc.) via fasteners inserted through slots 22 of bracket 16 and into first and second passages 19, 20 of rail 18, or into third and fourth passages 33, 35 of rail 18.

For example and as shown in FIG. 1, rail 18 can be mounted to a cabinet bracket 16 with fasteners inserted through slots 22 of bracket 16 and into first and second passages 19, 20 of rail 18, and rail 18D can be mounted to a cabinet bracket 16 with fasteners inserted through slots 22 of bracket 16 and into third and fourth passages 33, 35 of rail 18D.

It is also noted that rail 18 can be rotated/oriented so that rail 18 can be mounted to a cabinet bracket 16 with fasteners inserted through slots 22 of bracket 16 and into passages 33, 35 of rail 18, and that rail 18D can be rotated/oriented so that rail 18D can be mounted to a cabinet bracket 16 with fasteners inserted through slots 22 of bracket 16 and into passages 19, 20 of rail 18D. The same holds true for rails 18A and 18C of FIG. 1.

Referring to FIG. 3, an exemplary rail member 18 is depicted. It is to be appreciated that a discussion of rail member 18 also applies to the other rail members 18A, 18B, 18C, 18D, 18E, etc., of system 10.

As shown in FIG. 3, each rail member 18 (or 18A, 18B, etc.) includes a first wall 41, with second and third walls 42, 43 connected to and running/oriented transverse to first wall 41. Fourth and fifth walls 44, 45 extend transversely from second wall 42, and sixth and seventh walls 46, 47 extend transversely from third wall 43.

As such and as shown in FIG. 3, at least a portion of walls 41, 42 and 43 define first channel 21 of rail 18, at least a portion of walls 41, 42 and 43 define second channel 23 of rail 18, at least a portion of walls 42, 44 and 45 define third channel 25 of rail 18, and at least a portion of walls 43, 46 and 47 define fourth channel 27 of rail 18.

In exemplary embodiments, each channel 21, 23, 25 and 27 takes the form of a U-shaped or C-shaped channel or the like, although the present disclosure is not limited thereto.

Second wall 42 includes grooves 42A and 42B, third wall 43 includes grooves 43A and 43B, fourth wall 44 includes groove 44A, fifth wall 45 includes groove 45A, sixth wall 46 includes groove 46A, and seventh wall includes groove 47A.

Still referring to FIG. 3, fourth wall 44 includes a first extension wall 48 (e.g., L-shaped extension wall 48). Third passage 33 is formed/defined between walls 42 and 48, and wall 48 defines recess 37.

Fifth wall 45 includes a second extension wall 49 (e.g., L-shaped extension wall 49). First passage 19 is formed/defined between walls 42 and 49, and wall 49 defines recess 29.

Sixth wall 46 includes a third extension wall 50 (e.g., L-shaped extension wall 50). Fourth passage 35 is formed/defined between walls 43 and 50, and wall 50 defines recess 39.

Seventh wall 47 includes a fourth extension wall 51 (e.g., L-shaped extension wall 51). Second passage 20 is formed/defined between walls 43 and 51, and wall 51 defines recess 31.

Referring again to FIG. 1, exemplary system 10 includes rails 18 and 18A mounted to cabinet brackets 16 of cabinets 14 of first row 13, and includes rails 18C and 18D mounted to cabinet brackets 16 of cabinets of second row 15. As discussed further below, rail 18B is mounted to and runs (is positioned) transverse to rails 18A, 18C, and rail 18E is mounted to and runs (is positioned) transverse to rails 18, 18D.

In exemplary embodiments and as shown in FIGS. 1, 3, 12 and 13, linear adjacent rail members 18 and 18A (and also 18C and 18D) can be mounted together via one or more splice members 24.

Figure 12:
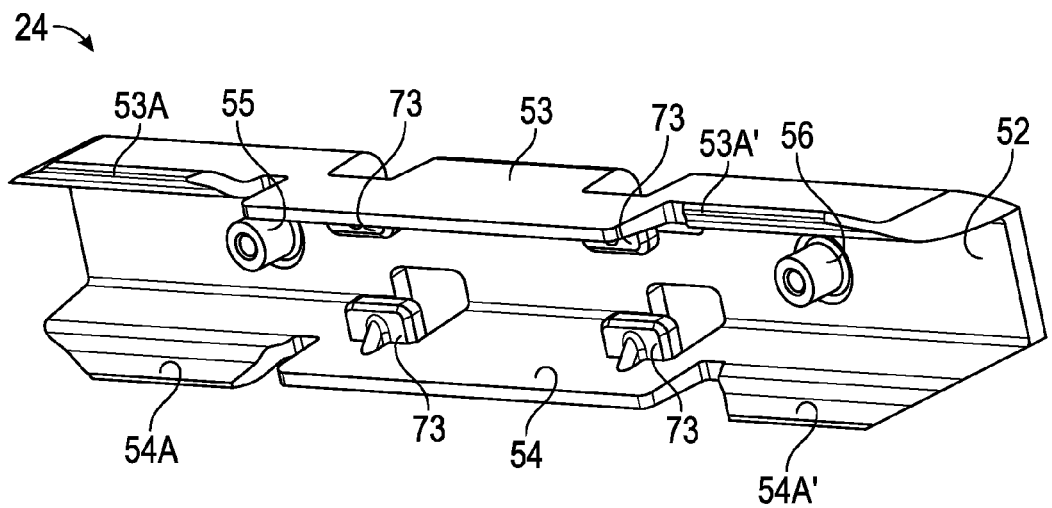
FIG. 12 is a front perspective view of another exemplary splice member of a containment system of the present disclosure.
Figure 13:
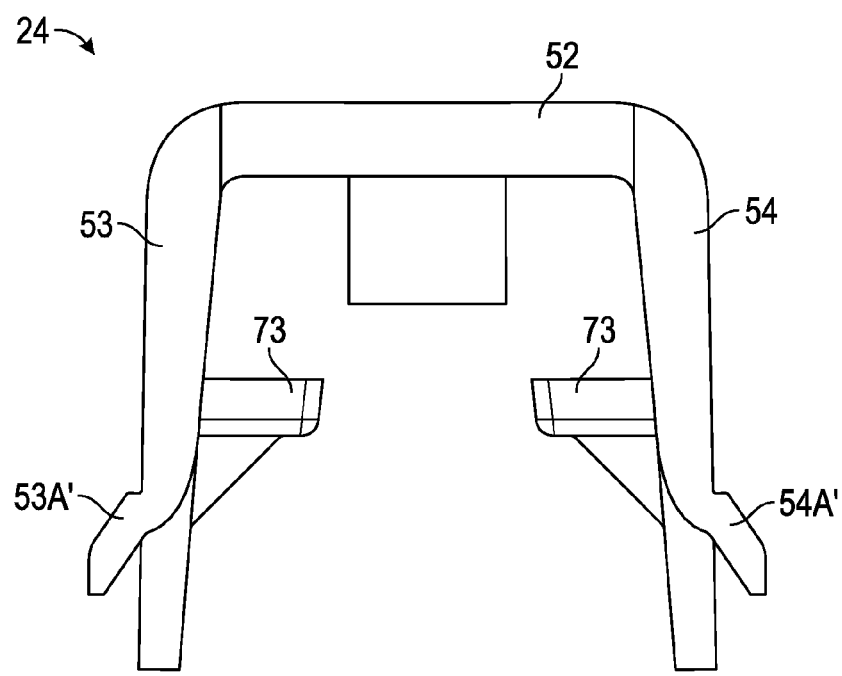
FIG. 13 is an end view of the splice member of FIG. 12.

As shown in FIGS. 12 and 13, exemplary splice member 24 includes a base wall 52, with first and second arm walls 53, 54 connected to and running/oriented transverse to base wall 52 to define a substantially U-shaped or C-shaped splice member 24. First arm wall 53 includes one or more angled protruding sections 53A extending from wall 53, and second arm wall 54 includes one or more angled protruding sections 54A extending from wall 54.

In an example embodiment and as shown in FIG. 1, a splice member 24 can be positioned within first channels 21 of rails 18, 18A so that: (i) protruding section 53A is positioned within groove 42B of rail 18 and protruding section 54A is positioned within groove 43B of rail 18, and (ii) protruding section 53A' is positioned within groove 42B of rail 18A and protruding section 54A' is positioned within groove 43B of rail 18A. A fastener member can be inserted through first boss member 55 and into rail 18, and another fastener member can be inserted through second boss member 56 and into rail 18A to securely mount rails 18, 18A to one another.

It is noted that in addition to or in lieu of splice member 24 being positioned within channels 21 of rails 18, 18A, splice member 24 can be similarly positioned within channels 23, 25 and/or 27 of rails 18, 18A to similarly secure rails 18, 18A to one another.

More specifically, a splice member 24 can be positioned within channels 23 of rails 18, 18A so that: (i) protruding section 53A' is positioned within groove 42A of rail 18 and protruding section 54A' is positioned within groove 43A of rail 18, and (ii) protruding section 53A is positioned within groove 42A of rail 18A and protruding section 54A' is positioned within groove 43A of rail 18A.

Moreover, a splice member 24 can be positioned within channels 25 of rails 18, 18A so that: (i) protruding section 53A is positioned within groove 45A of rail 18 and protruding section 54A is positioned within groove 44A of rail 18, and (ii) protruding section 53A' is positioned within groove 45A of rail 18A and protruding section 54A' is positioned within groove 44A of rail 18A.

Furthermore, a splice member 24 can be positioned within channels 27 of rails 18, 18A so that: (i) protruding section 53A is positioned within groove 46A of rail 18 and protruding section 54A is positioned within groove 47A of rail 18, and (ii) protruding section 53A' is positioned within groove 46A of rail 18A and protruding section 54A' is positioned within groove 47A of rail 18A.

Other linearly adjacent rail members 18 (e.g., rails 18C and 18D) of system 10 can similarly be secured together via one or more splice members 24, as similarly discussed in conjunction with rails 18, 18A.

In exemplary embodiments and as shown in FIGS. 1, 3, 5 and 6, perpendicular adjacent rail members 18 (e.g., members 18 and 18E; members 18A and 18B, etc.) can be mounted together via a corner splice member 26 and/or an angled splice member 28.

Figure 6:
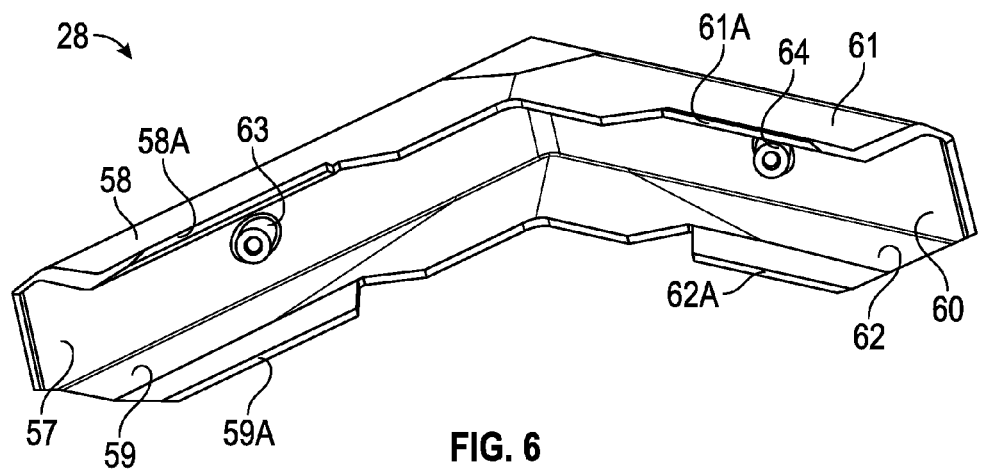
FIG. 6 is a rear perspective view of an exemplary inside corner member of a containment system of the present disclosure.
Figure 7:
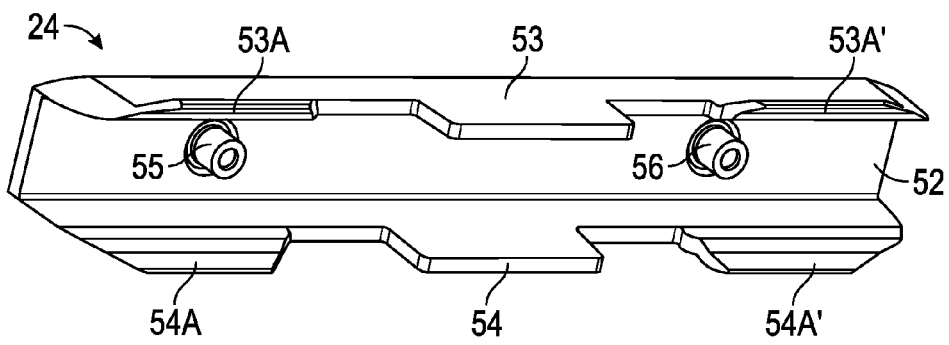
FIG. 7 is a front perspective view of an exemplary splice member of a containment system of the present disclosure.

As shown in FIG. 6, exemplary angled splice member 28 includes a first base wall 57, with first and second arm walls 58, 59 connected to and running/oriented transverse to first base wall 57 to define a substantially U-shaped or C-shaped first portion of member 28. First arm wall 58 includes an angled protruding section 58A extending from wall 58, and second arm wall 59 includes an angled protruding sections 59A extending from wall 59.

As shown in FIG. 6, member 28 also includes a second base wall 60 connected to and running/oriented transverse to first base wall 57, with first and second arm walls 61, 62 connected to and running/oriented transverse to second base wall 60 to define a substantially U-shaped or C-shaped second portion of member 28. First arm wall 61 includes an angled protruding section 61A extending from wall 61, and second arm wall 62 includes an angled protruding sections 62A extending from wall 62.

In an example embodiment and as shown in FIGS. 1, 3 and 6, an angled splice member 28 can be positioned within channels 23 of rails 18, 18E so that: (i) protruding section 58A is positioned within groove 42A of rail 18 and protruding section 59A is positioned within groove 43A of rail 18, and (ii) protruding section 61A is positioned within groove 42A of rail 18E and protruding section 62A is positioned within groove 43A of rail 18E.

A fastener member can be inserted through first boss member 63 and into rail 18, and another fastener member can be inserted through second boss member 64 and into rail 18E to securely mount rails 18, 18E to one another.

It is also noted that rails 18, 18E can be rotated/oriented so that an angled splice member 28 can be positioned within channels 21 of rails 18, 18E so that: (i) protruding section 58A is positioned within groove 42B of rail 18 and protruding section 59A is positioned within groove 43B of rail 18, and (ii) protruding section 61A is positioned within groove 42B of rail 18E and protruding section 62A is positioned within groove 43B of rail 18E.

Other rotations/orientations of rails 18, 18E are also possible (e.g., member 28 within channel 21 of rail 18 and within channel 23 of rail 18E; member 28 within channel 23 of rail 18 and within channel 21 of rail 18E).

Angled splice members 28 can similarly positioned and secured between the other perpendicular adjacent rail members 18 (e.g., members 18A and 18B; members 18B and 18C; members 18D and 18E) of system, with the members 28 positioned within channels 21 and/or 23 of the other rail members 18.

As noted, perpendicular adjacent rail members 18 (e.g., members 18 and 18E; members 18A and 18B, etc.) can be mounted together via a corner splice member 26.

Figure 5:
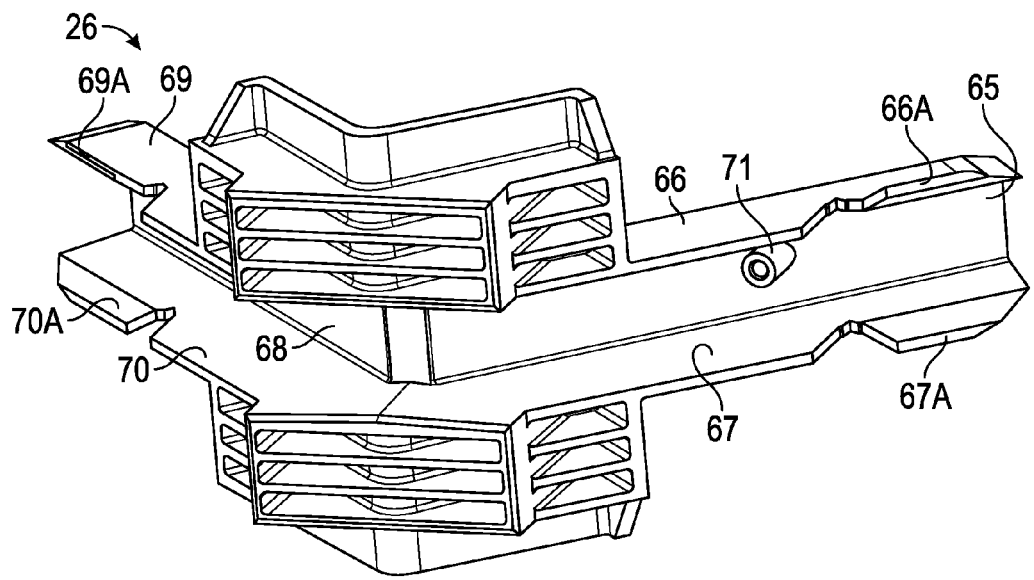
FIG. 5 is a front perspective view of an exemplary outside corner member of a containment system of the present disclosure.

As shown in FIG. 5, exemplary corner splice member 26 includes a first base wall 65, with first and second arm walls 66, 67 connected to and running/oriented transverse to first base wall 65 to define a substantially U-shaped or C-shaped first portion of member 26. First arm wall 66 includes an angled protruding section 66A extending from wall 66, and second arm wall 67 includes an angled protruding sections 67A extending from wall 67.

As shown in FIG. 5, member 26 also includes a second base wall 68 connected to and running/oriented transverse to first base wall 65, with first and second arm walls 69, 70 connected to and running/oriented transverse to second base wall 68 to define a substantially U-shaped or C-shaped second portion of member 26. First arm wall 69 includes an angled protruding section 69A extending from wall 69, and second arm wall 70 includes an angled protruding sections 70A extending from wall 70.

In an example embodiment and as shown in FIGS. 1, 3 and 5, an angled splice member 28 can be positioned within channels 21 of rails 18, 18E so that: (i) protruding section 66A is positioned within groove 42B of rail 18 and protruding section 67A is positioned within groove 43B of rail 18, and (ii) protruding section 69A is positioned within groove 42B of rail 18E and protruding section 70A is positioned within groove 43B of rail 18E.

A fastener member can be inserted through first boss member 71 and into rail 18, and another fastener member can be inserted through second boss member 72 (FIG. 1) and into rail 18E to securely mount rails 18, 18E to one another.

It is also noted that rails 18, 18E can be rotated/oriented so that an corner splice member 26 can be positioned within channels 23 of rails 18, 18E so that: (i) protruding section 66A is positioned within groove 42A of rail 18 and protruding section 67A is positioned within groove 43A of rail 18, and (ii) protruding section 69A is positioned within groove 42A of rail 18E and protruding section 70A is positioned within groove 43A of rail 18E.

Other rotations/orientations of rails 18, 18E are also possible (e.g., member 26 within channel 21 of rail 18 and within channel 23 of rail 18E; member 26 within channel 23 of rail 18 and within channel 21 of rail 18E).

Corner splice members 26 can similarly positioned and secured between the other perpendicular adjacent rail members 18 (e.g., members 18A and 18B; members 18B and 18C; members 18D and 18E) of system, with the members 26 positioned within channels 21 and/or 23 of the other rail members 18.

Referring again to FIG. 1, one or more panel members 30, 30A, etc., (e.g., clear panel members 30; Ceilume panels 30; clear polycarbonate sheets 30; etc.) can be inserted within the appropriate channels 21, 23 of members 18, 18A, etc. (depending on the rotation/orientation of members 18, 18A, etc.) to extend horizontally across aisle 12 between rows 13, 15 to form horizontal containment system 10 for data center 11.

For example and as shown in FIG. 1, panel 30 extends from rail 18 to rail 18D, and also extends to rail 18E and to panel 30A.

Panel 30A extends from rail 18 to rail 18D, and also extends to panel 30 and to panel 30B.

Panel 30B extends from rails 18, 18A to rails 18D, 18C, and also extends to panel 30A and to panel 30C.

Panel 30C extends from rail 18A to rail 18C, and also extends to rail 18B and to panel 30B.

In exemplary embodiments, panel members 30, 30A, etc. (FIG. 2) are substantially planar and rectangular/square, although the present disclosure is not limited thereto.

Panel members 30, 30A, etc. can be releasably secured within respective channels 21, 23 of rails 18 via clips 32 positioned in respective channels 21, 23.

Adjacent panel members 30 (e.g., 30, 30A) can be secured together via a panel joiner 34 (e.g., flexible rubber panel joiner 34). In some embodiments, it is noted that panel joiner 34 takes the form of a plastic extrusion member 34, and may not be flexible. In other embodiments, panel joiner 34 can be flexible and/or extendable.

In some embodiments, it is noted that adjacent panels 30 may overlap one another (e.g., to prevent the need for cutting panels 30 and/or to provide for future adjustability of panels 30 and/or system 10). Thus, such adjacent panels 30 may not include joiners 34.

In some embodiments and as shown in FIG. 1, cabinet seals 36 can be secured to rail members 18, 18A, etc. (e.g., secured to walls 46 and/or 47) and extend to and/or past cabinets 14, as shown in FIG. 1.

Figure 14:
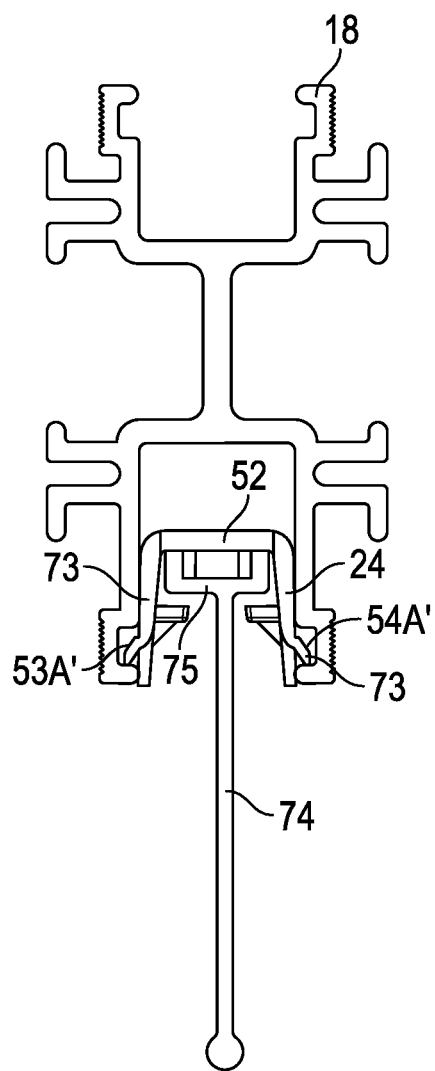
FIG. 14 is an end view of the splice member of FIG. 12 mounted to an exemplary rail member.
Figure 15:
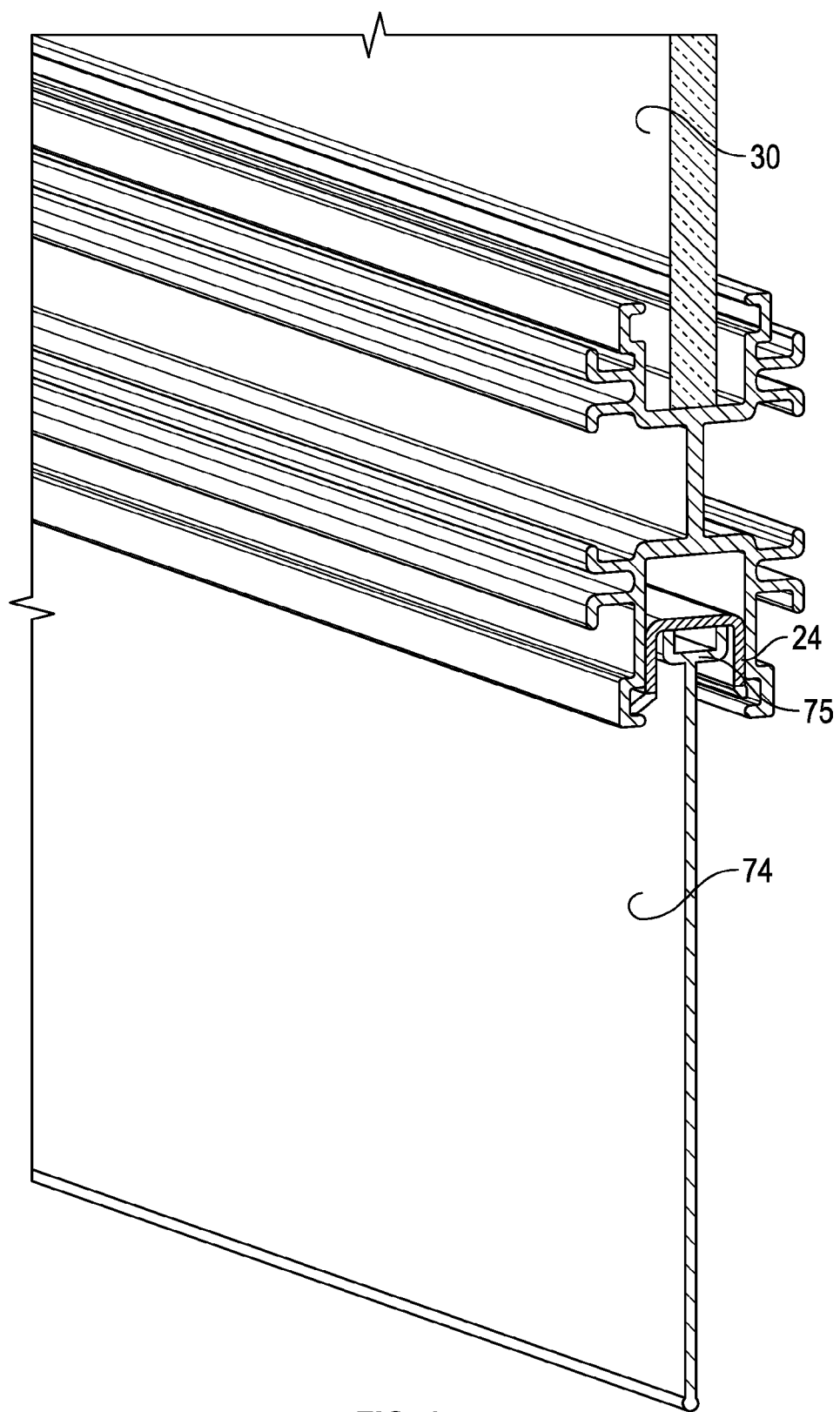
FIG. 15 is a side perspective view of the members of FIG. 14.

In some embodiments and as shown in FIGS. 12-14, the splice member 24 includes one or more mounting protrusions 73 extending from walls 53 and/or 54. For example, member 24 can include two protrusions 73 extending from wall 53, and two protrusions 73 extending from wall 54.

A seal member 74 (e.g., cabinet seal, wiper seal, flap seal, etc.) can be secured to splice member 24, with a mounting surface 75 of the seal member 74 being securely positioned between the protrusions 73 and the base wall 52 of the splice member 24.

In certain embodiments and as shown in FIGS. 3 and 12-14, the splice member 24 with mounted seal member 74 can then be positioned within channel 27 of desired rail 18 (or 18A, etc.) so that protruding section 53A, 53A' are positioned within groove 46A of rail 18 and protruding sections 54A, 54A' are positioned within groove 47A of rail 18. Similar to cabinet seals 36, seal members 74 can extend from rail 18 to and/or past cabinets 14.

It is also noted that member 24 can be rotated so that sections 53A, 53A' are in groove 47A, and sections 54A, 54A' are in groove 46A.

Moreover, it is also noted that splice members 24 with mounted seal members 74 can be positioned in the respective grooves of channels 21, 23 and/or 25 (e.g., so that sections 53A, 53A' are positioned within groove 42B and sections 54A, 54A' are positioned within groove 43B; so that sections 53A, 53A' are positioned within groove 44A and sections 54A, 54A' are positioned within groove 45A; so that sections 53A, 53A' are positioned within groove 43A and sections 54A, 54A' are positioned within groove 42A), as desired (e.g., for sealing purposes).

Figure 16:
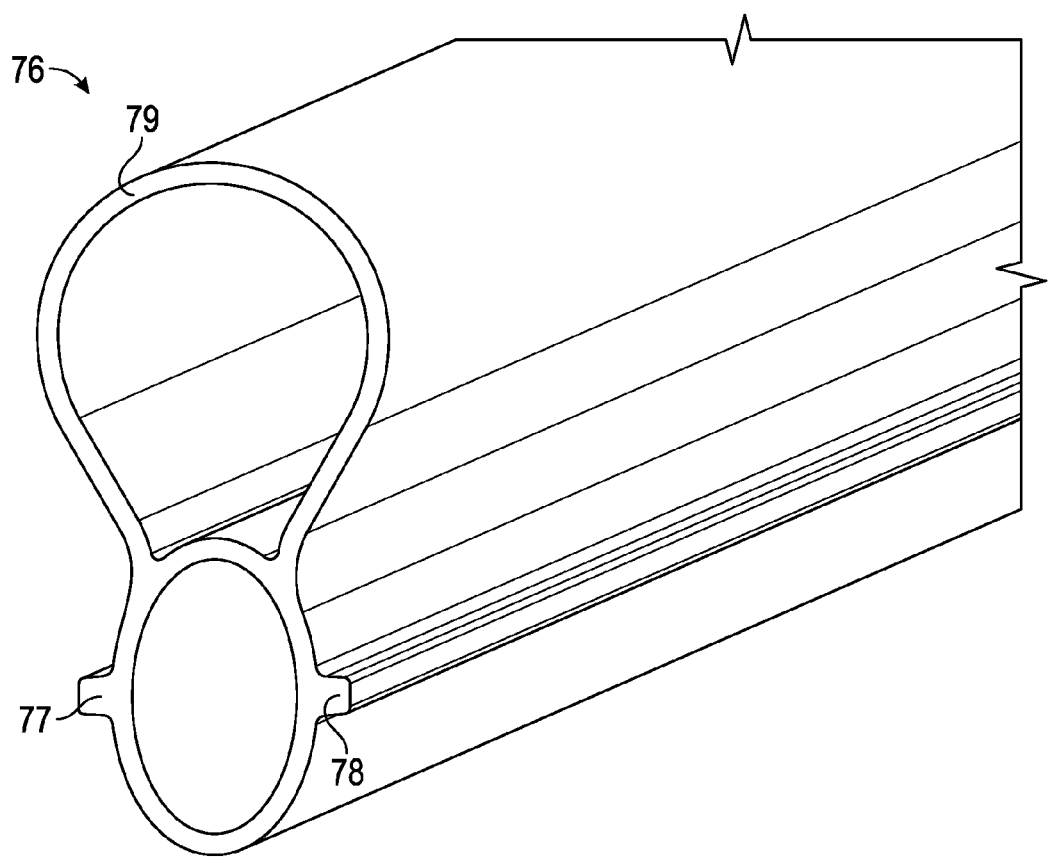
FIG. 16 is a side perspective view of an exemplary bulb seal.
Figure 18:
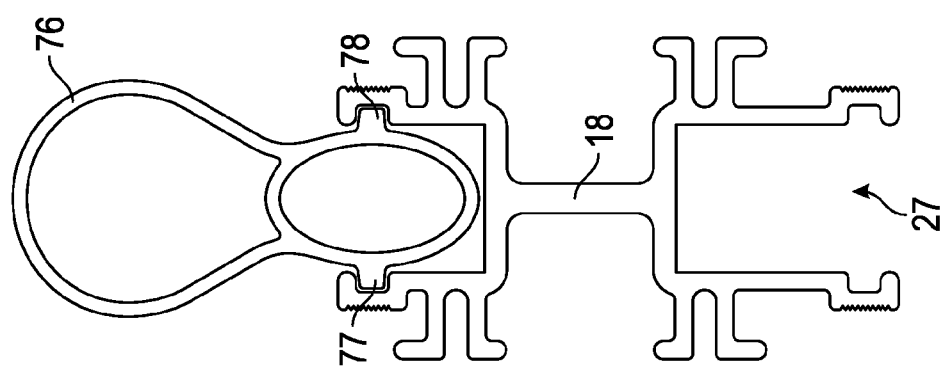
FIG. 18 is an end view of the bulb seal of FIG. 17 mounted to an exemplary rail member.
Figure 17:
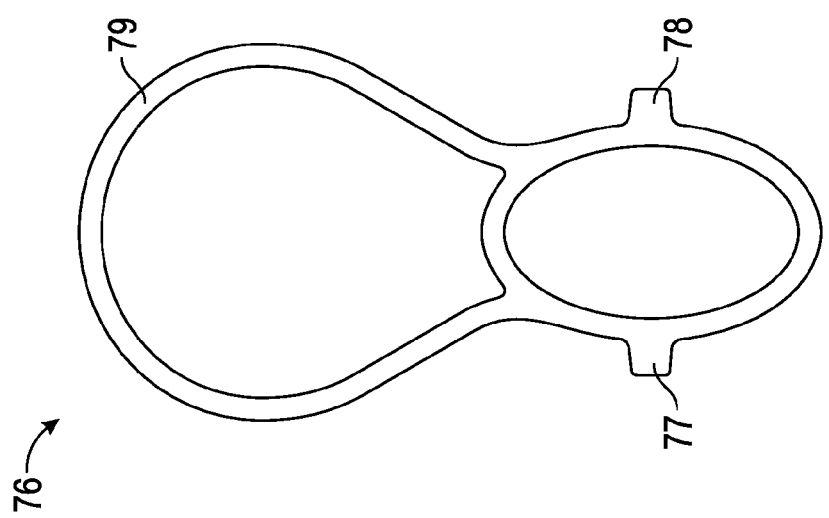
FIG. 17 is an end view of the bulb seal of FIG. 16.
Figure 19:
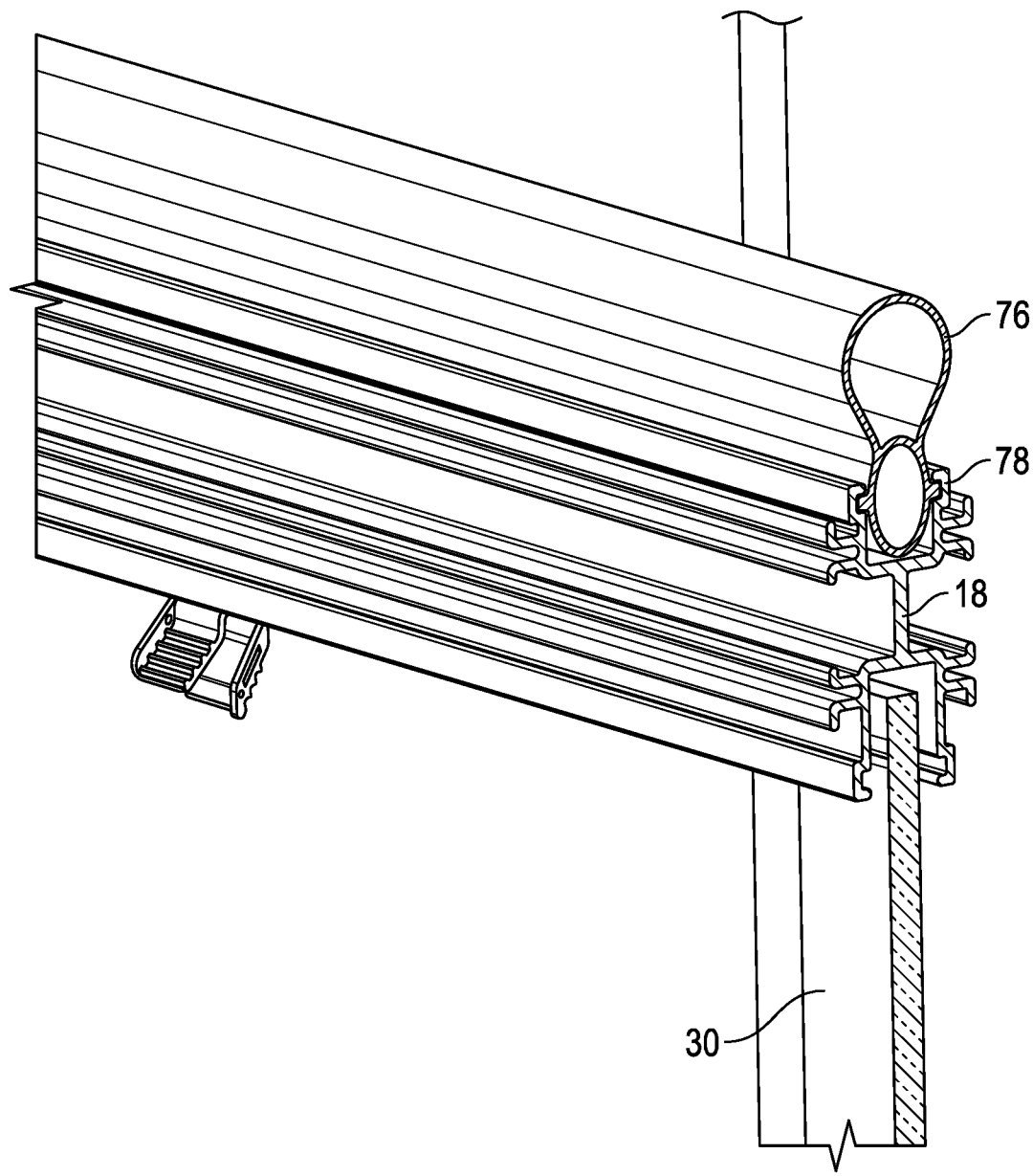
FIG. 19 is a side perspective view of the members of FIG. 18.

In certain embodiments, a bulb seal 76 can be inserted into a desired rail 18 (or 18A, etc.). As shown in FIG. 16, exemplary bulb seal 76 includes first and second protruding walls 77, 78 and a sealing section 79.

In certain embodiments and as shown in FIGS. 3 and 16-18, the bulb seal 76 can be positioned within channel 25 of desired rail 18 (or 18A, etc.) so that protruding wall 77 is positioned within groove 44A of rail 18 and protruding wall 78 is positioned within groove 45A of rail 18 (e.g., to provide a vertical seal or the like).

It is also noted that bulb seal 76 can be rotated so that wall 77 is in groove 45A, and wall 78 is in groove 44A.

Moreover, it is also noted that bulb seal 76 can be positioned in the respective grooves of channels 21, 23 and/or 27 (e.g., so that wall 77 is positioned within groove 42B and wall 78 is positioned within groove 43B; so that wall 77 is positioned within groove 47A and wall 77 is positioned within groove 46A; so that wall 77 is positioned within groove 43A and wall 78 is positioned within groove 42A), as desired (e.g., for sealing purposes).

For example, bulb seal 76 can be inserted into channel 27 of rail 18 to provide a seal to the side of cabinet(s) 14 (e.g., when used in a filler panel application, the seal 79 extending inside the aisle 12 to the ground in some cases). In this regard and with respect to providing a filler panel application, such can be utilized to create filler panels for missing cabinets in the aisle 12, and/or for providing for gaps in the aisle 12.

Figure 8:
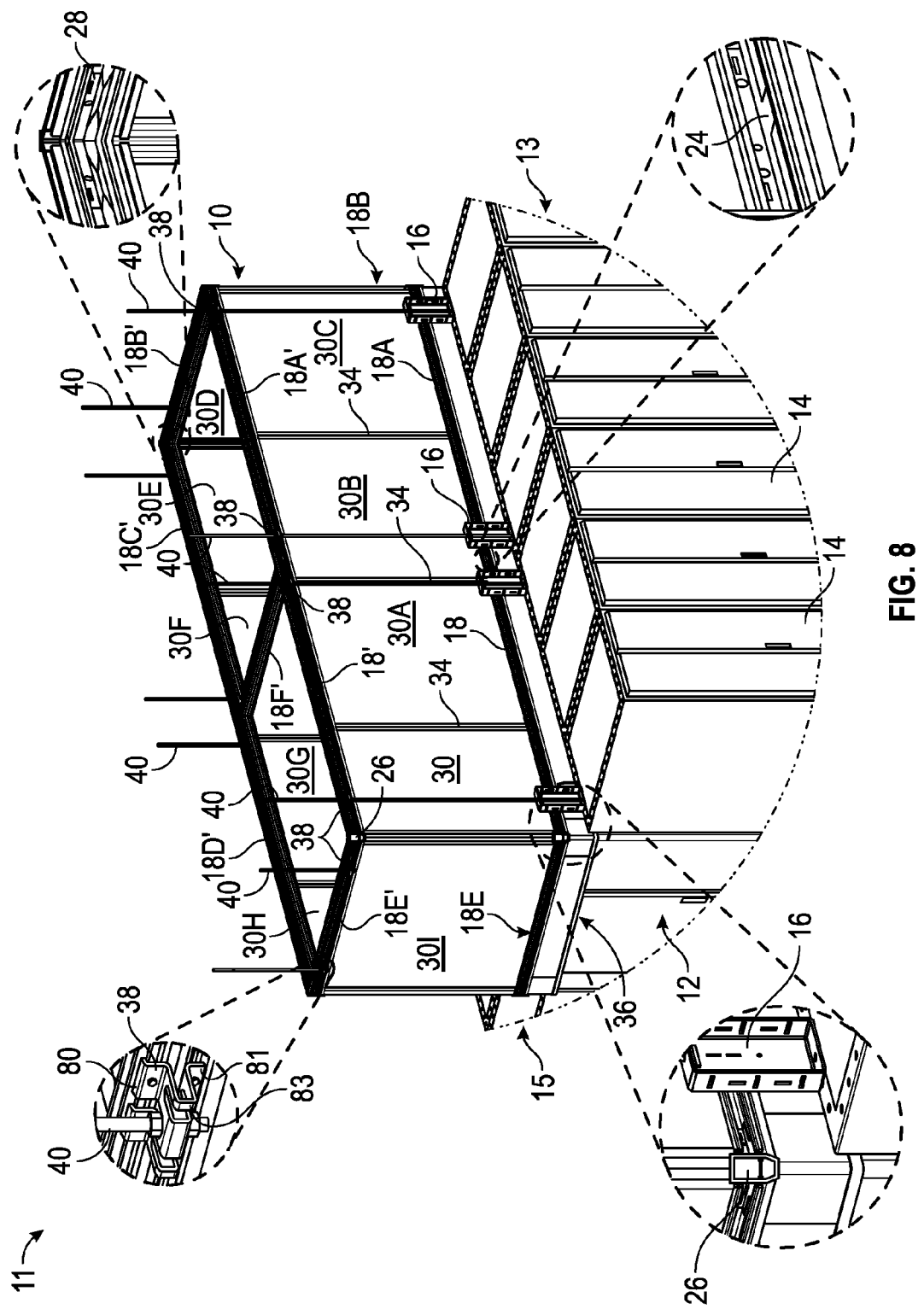
FIGS. 8-11 are side perspective views of other exemplary containment systems of the present disclosure.

FIG. 8 depicts containment system 10 deployed in a vertical orientation (e.g., cabinet 14 supported). A plurality of cabinet brackets 16 are mounted to the top of a plurality of different cabinets 14.

Each cabinet bracket 16 can then be mounted to a respective lower rail member 18, 18A, etc. as discussed above in connection with FIG. 1.

Linear adjacent lower rail members 18 (e.g., members 18 to 18E) can be mounted together via splice members 24, as needed and as discussed above relative to FIG. 1.

Similarly and as discussed above relative to FIG. 1, perpendicular adjacent lower rail members 18 (e.g., 18 and 18E, etc.) can be mounted together via corner splice members 26 and/or angled splice members 28. As such, lower rail members 18 through 18E can form a structure similar to the one depicted and discussed in FIG. 1.

A plurality of hanger brackets 38 are mounted to a plurality of different overhead supports 40 (e.g., threaded rods 40). Supports 40 may or may not extend to cabinets brackets 16. In some embodiments, supports 40 can be mounted to brackets 16 as well.

Figure 2:
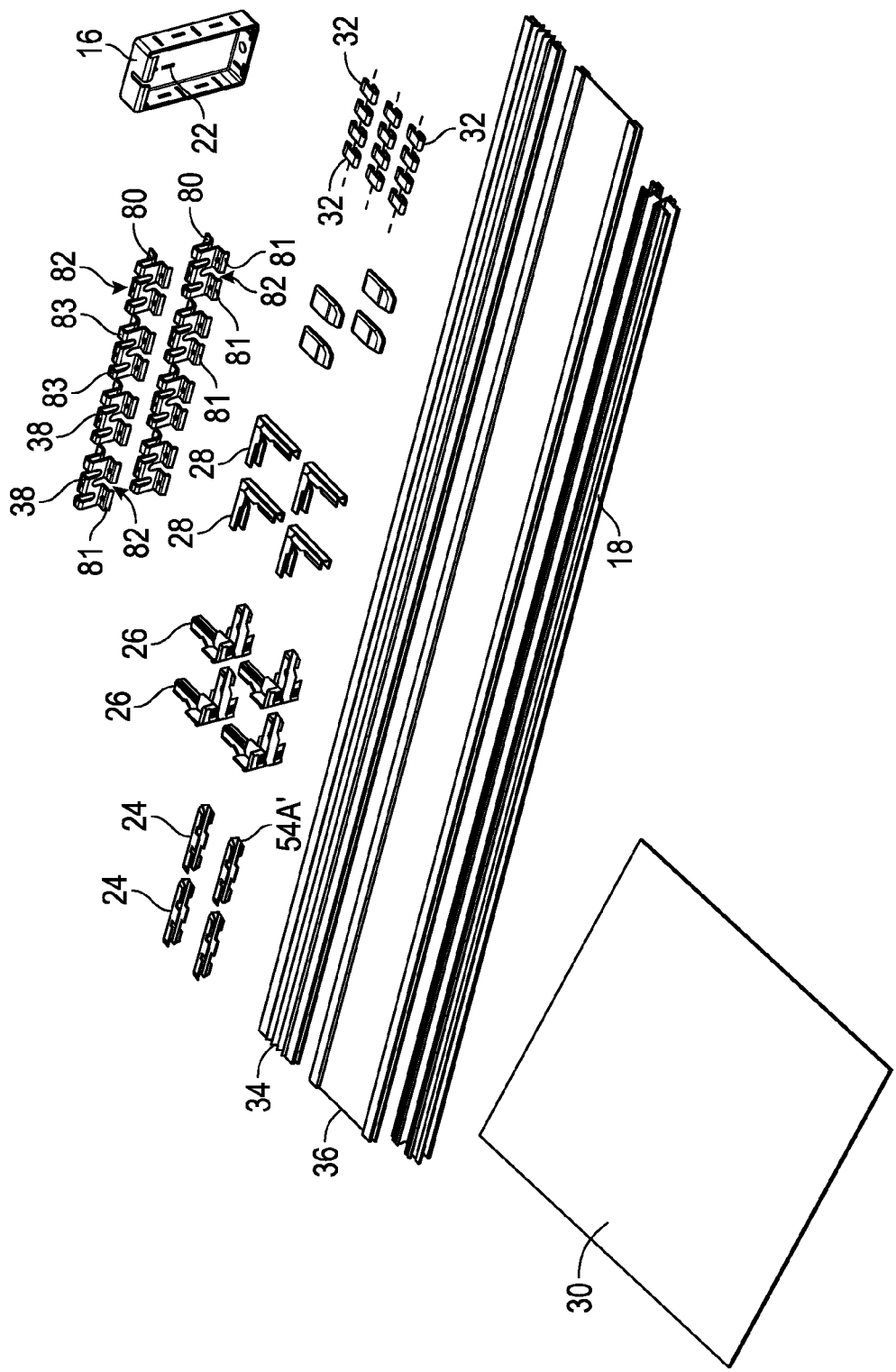
FIG. 2 is a top perspective view of some exemplary components of a containment system of the present disclosure.
Figure 4:
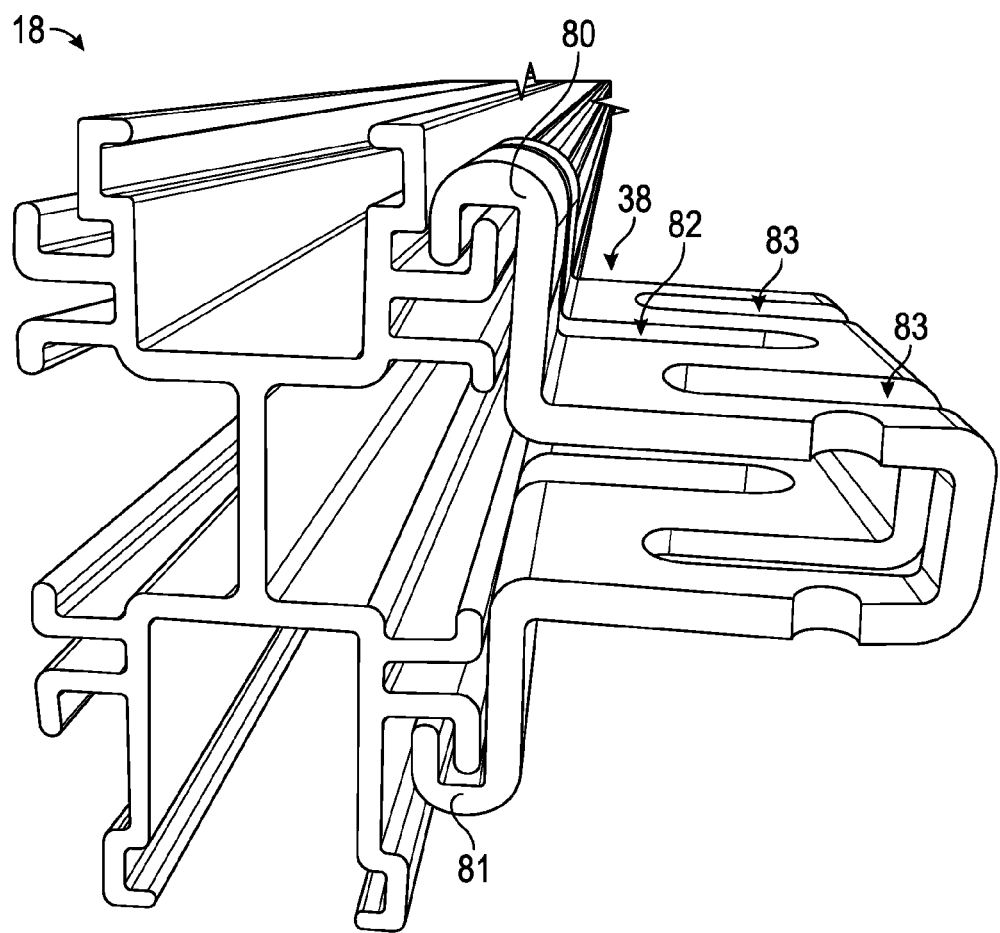
FIG. 4 is an end perspective view of a rail member with an exemplary hanger bracket mounted thereon.

Each hanger bracket 38 can be mounted to a respective upper rail member 18', 18A', etc. As shown in FIGS. 2, 4 and 8, each hanger bracket 38 includes first and second curved sections 80, 81. Hanger bracket 38 can be secured to rail 18' (or 18A', etc.) by positioning first curved section 80 into first recess 29 of rail 18', and by positioning second curved section 81 into second recess 31 of rail 18'.

It is also noted that bracket 38 can be rotated so that section 80 goes in recess 31, and section 81 goes in recess 29.

Moreover, it is also noted that rail 18' can be rotated so that so that section 80 goes in recess 37, and section 81 goes in recess 39 (or so that section 80 goes in recess 39, and section 81 goes in recess 37).

After bracket 38 is mounted to rail 18' (or 18A', etc.), the support 40 is positioned through slot 82 of bracket 38. Fastener members can secure support 40 to the top and bottom portions of slot 82.

When hanger bracket 38 is mounted to first and second recesses 29, 31 of rail 18', the bracket 38 can then mounted to first and second passages 19, 20 of upper rail members 18' (e.g., via fasteners positioned through/within brackets 38 and passages 19, 20).

When hanger bracket 38 is mounted to recesses 37, 39 of rail 18', the bracket 38 can then mounted to passages 33, 35 of upper rail member 18' (or 18A, etc.).

Splice members 24, corner splice members 26 and/or angled splice members 28 can be similarly utilized with upper rails 18', 18A', etc.

More particularly, linear adjacent upper rail members 18' (e.g., members 18' to 18E') can be mounted together via splice members 24, as needed and as discussed above relative to FIG. 1.

Similarly and as discussed above relative to FIG. 1, perpendicular adjacent upper rail members 18' (e.g., 18' and 18E', and 18F') can be mounted together via corner splice members 26 and/or angled splice members 28. As such, upper rail members 18' through 18E' can form a structure similar to the one depicted and discussed in FIG. 1, with the structure of mounted rails 18' through 18E' elevated above mounted rails 18 through 18E (FIG. 8), via brackets 38.

As shown in FIG. 8, upper rails 18' etc. can also include a transverse rail 18F'. Rail 18F' can be mounted to rails 18' and/or 18A', and also to 18C' and/or 18D' via angled splice members 24 positioned within the appropriate grooves (e.g., 42B, 43B, 42A, 43A) of channels 21 and/or 23 of rails 18', 18A', 18C', 18D' and/or 18F'.

In other embodiments, it is noted that 18F' can be mounted to rails 18' and/or 18A', and also to 18C' and/or 18D' via angled splice members 24 positioned within the appropriate grooves of channels 21 and/or 23 of rails 18', 18A', 18C' and/or 18D', and with angled splice members 24 positioned within the appropriate grooves of channels 25 and/or 27 of rail 18F'.

It is also noted that lower rails 18' etc. can include a transverse rail 18F, similarly mounted to rails 18' and/or 18A', and also to 18C' and/or 18D' via angled splice members 24 positioned within the appropriate grooves of rails 18', 18A', 18C', 18D' and/or 18F'.

Panel members 30, 30A, etc. can be inserted within channels 25 of lower rails 18, 18A, etc., and within channels 27 of upper rails 18', 18A', etc. to extend vertically between lower rails (18, 18A, etc.) and upper rails (18', 18A', etc.).

In this regard, it is noted that in some embodiments, the linear distance between wall 43 to the ends of walls 46, 47 of channel 27 is greater than the linear distance between wall 42 to the ends of walls 44, 45 of channel 25.

This greater linear distance of channel 27 compared to channel 25 (and compared to channels 21, 23) advantageously allows a user to first position a panel 30 up against wall 43 of channel 27 of upper rail 18', and then position the panel 30 above channel 25 of lower rail 18 and thereafter drop panel 30 into engagement against wall 42 of channel 25 of lower rail 18.

Panel members 30 can be secured within channels 25 and/or 27 via clips 32 positioned in channels 25, 27.

Adjacent panel members 30 (e.g., 30/30A, 30/30I) can be secured together via a panel joiner 34 (e.g., flexible rubber panel joiner 34). In other embodiments and as noted, panels 30, 30A, etc. can overlap one another (and not include joiner 34).

In some embodiments, it is noted that panel joiner 34 takes the form of a plastic extrusion member 34, and may not be flexible, and may not be utilized to form corners. In such cases, corners can be formed by bending panels 30 (e.g., 30, 30I).

Cabinet seals 36 can be secured to upper and/or lower rail members 18, 18', etc.

As similarly discussed above, a splice member 24 with mounted seal member 74 can be positioned within a desired channel 21, 23, 25, 27 of desired rails 18, 18' etc.

Moreover, a bulb seal 76 can be positioned within a desired channel 21, 23, 25, 27 of desired rails 18, 18' etc.

For example, a bulb seal 76 can be inserted into groove 25 of upper rail 18', etc. to provide a vertical seal to the ceiling or the like. In other embodiments, a bulb seal 76 can be inserted into groove 27 of lower rail 18, etc. to provide a seal to the side of cabinet(s) 14 (e.g., when used in a filler panel application, the seal 79 extending inside the aisle 12 to the ground in some cases). In this regard and with respect to providing a filler panel application, such can be utilized to create filler panels for missing cabinets in the aisle 12, and/or for providing for gaps in the aisle 12.

In some embodiments and with reference to FIGS. 1 and 8, it is noted that system 10 can provide for a horizontal portion of system 10 (e.g., FIG. 1), and also provide for a vertical portion of system 10 (e.g., FIG. 8), and then back to a horizontal portion 10, etc. In other words, system 10 can have various and several horizontal and vertical portions that are attached to one another (e.g., in a step-wise up or down manner of horizontal portions and vertical portions). To continue an example embodiment, the left side of system 10 of FIG. 1 could be in the horizontal orientation, and the right side of system 10 could be in the vertical orientation and look similar to the right side of system 10 as depicted in FIG. 8.

Figure 9:
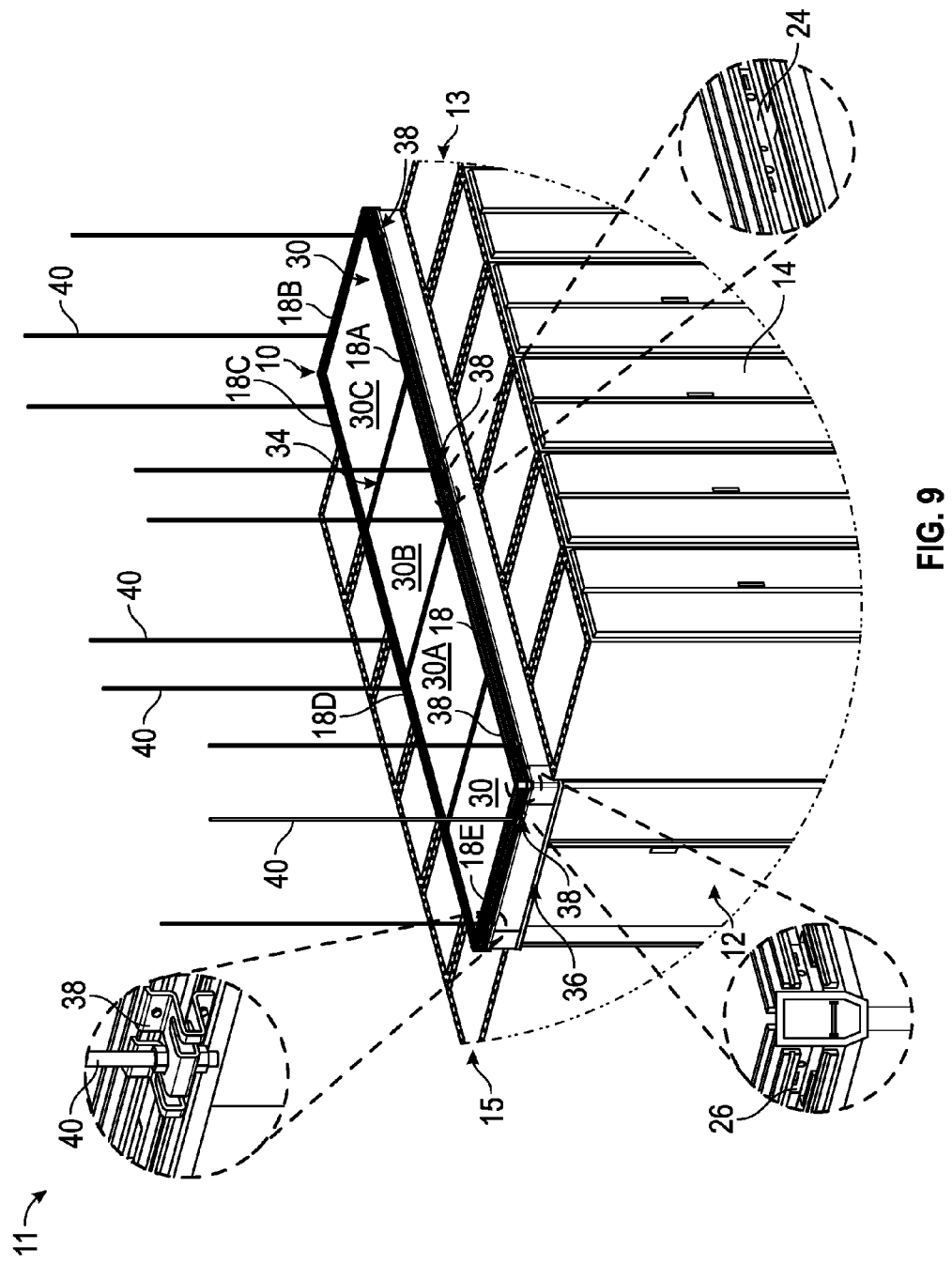

FIG. 9 depicts containment system 10 deployed in a horizontal orientation (e.g., support 40 supported).

A plurality of hanger brackets 38 can be mounted to the bottom of a plurality of different overhead supports 40.

Each hanger bracket 38 can be mounted to a rail member 18, 18A, etc., as discussed above.

Splice members 24, corner splice members 26, and/or angled splice members 28 can be similarly utilized with rails 18 through 18E, as discussed above.

Panel members 30, 30A can be inserted within respective channels 21, 23 of respective rails 18, 18A, etc. (and secured via clips 32) to extend horizontally across containment system 10.

Adjacent panel members 30 (e.g., 30, 30A) can be secured together via a panel joiner 34 (or via a transverse rail 18F, as discussed above). Cabinet seals 36 can be secured to rail members 18, as shown.

A splice member 24 with mounted seal member 74 can be positioned within a desired channel 21, 23, 25, 27 of desired rails 18, 18A, etc. Moreover, a bulb seal 76 can be positioned within a desired channel 21, 23, 25, 27 of desired rails 18, 18A, etc.

Figure 10:
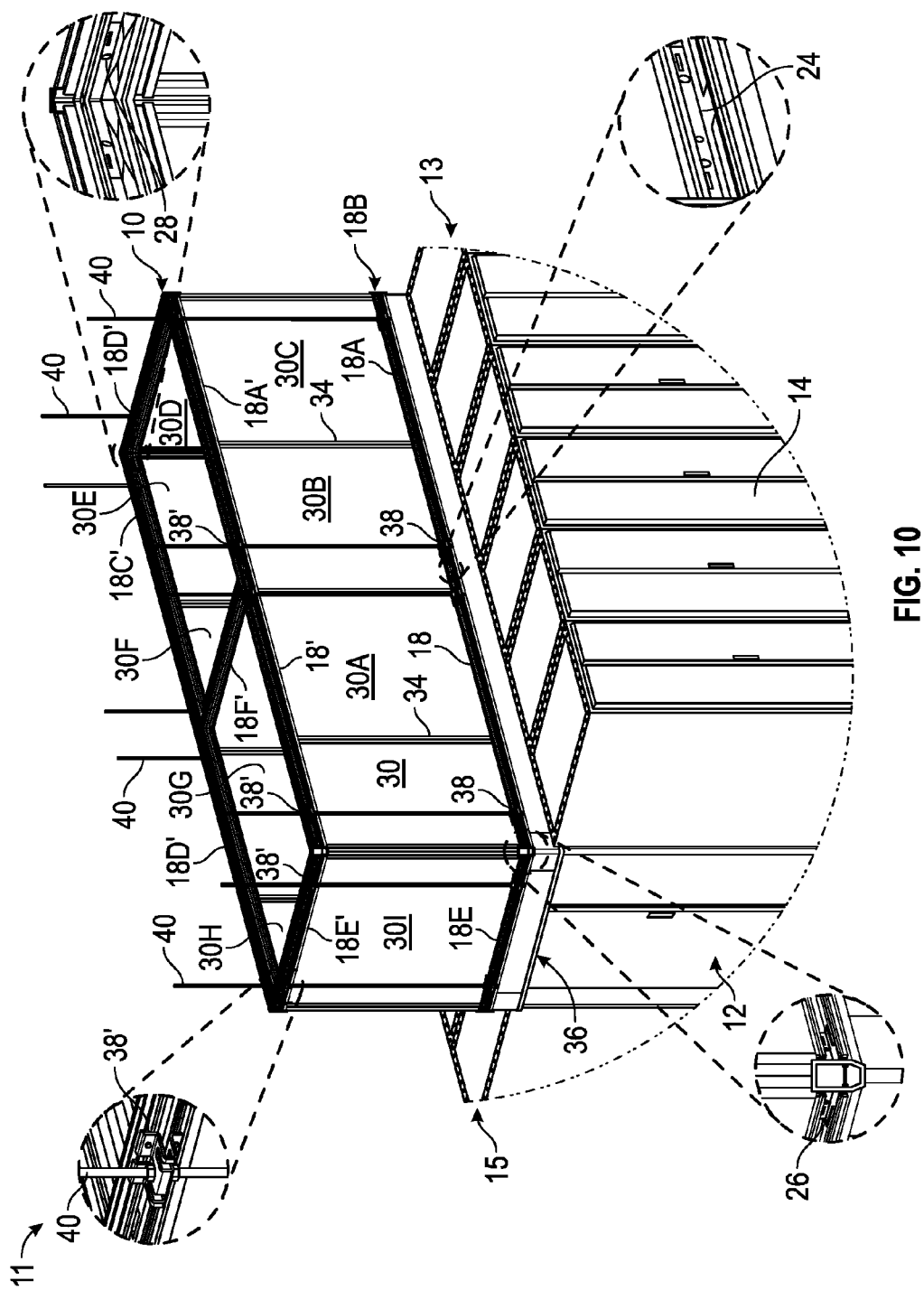

FIG. 10 depicts containment system 10 deployed in a vertical orientation (e.g., support 40 supported).

A plurality of lower hanger brackets 38 are mounted to the bottom of a plurality of different overhead supports 40. Each lower hanger bracket 38 can be mounted to a lower rail member 18, 18A, as discussed. Splice members 24, corner splice members 26, and/or angled splice members 28 can be similarly utilized with lower rails 18 through 18E, as discussed above.

A plurality of upper hanger brackets 38' are mounted to an upper portion of supports 40.

Each upper hanger bracket 38' can be mounted to an upper rail member 18', 18A', etc., as discussed. Splice members 24, corner splice members 26, and/or angled splice members 28 can be similarly utilized with upper rails 18' through 18E'.

Panel members 30, 30A, etc. can be inserted within channels 25 of lower rails 18 and within channels 27 of upper rails 18' to extend vertically between lower and upper rails 18, 18'.

Adjacent panel members 30 (e.g., 30/30A, 30/30I) can be secured together via a panel joiner 34 (e.g., rubber panel joiner 34). Cabinet seals 36 can be secured to lower or upper rail members 18, 18'.

A splice member 24 with mounted seal member 74 can be positioned within a desired channel 21, 23, 25, 27 of desired rails 18, 18', etc. A bulb seal 76 can be positioned within a desired channel 21, 23, 25, 27 of desired rails 18, 18', etc. System 10 of FIG. 10 can also include a transverse rail 18F', as similarly discussed above.

In some embodiments and with reference to FIGS. 9 and 10, it is noted that system 10 can provide for a horizontal portion of system 10 (e.g., FIG. 9), and also provide for a vertical portion of system 10 (e.g., FIG. 10), and then back to a horizontal portion 10, etc. In other words, system 10 can have various and several horizontal and vertical portions that are attached to one another (e.g., in a step-wise up or down manner of horizontal portions and vertical portions). To continue an example embodiment, the left side of system 10 of FIG. 9 could be in the horizontal orientation, and the right side of system 10 could be in the vertical orientation and look similar to the right side of system 10 as depicted in FIG. 10.

Figure 11:
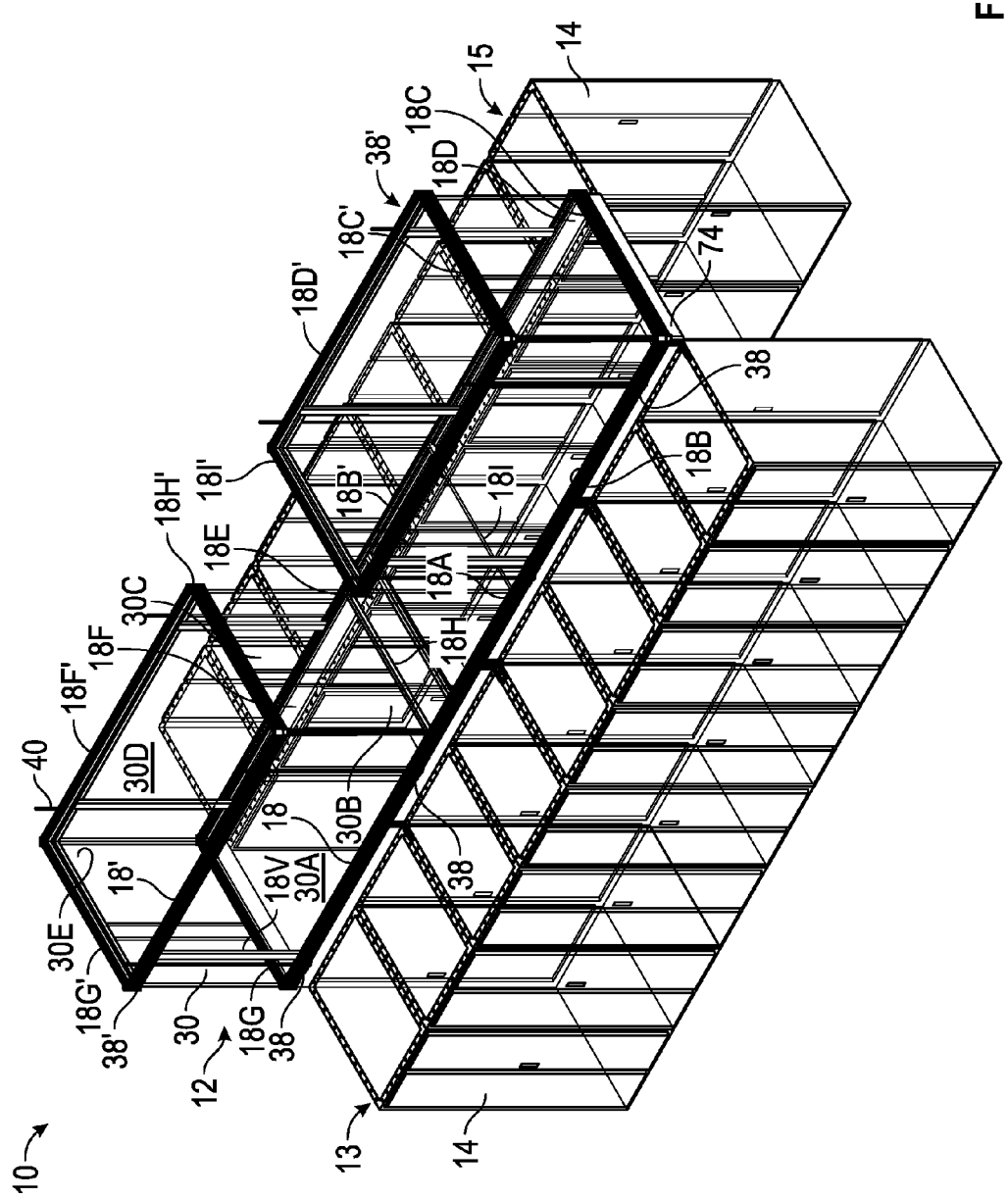

In another embodiment and as shown in FIG. 11, system 10 includes lower rails 18, 18B, etc. and upper rails 18, 18B', etc. as similarly constructed with brackets 38 and as discussed relative to FIGS. 9 and 10.

System 10 of FIG. 11 includes a first vertically contained portion via rails 18, 18H, 18F, 18G, 18', 18H', 18F', 18G' (and panels 30 therebetween).

System 10 of FIG. 11 also includes a second vertically contained portion via rails 18B, 18C, 18D, 18I, 18B', 18C', 18D', 18I' (and panels 30 therebetween).

System 10 of FIG. 11 also includes a horizontally contained portion vial rails 18A, 18I, 18E and 18H (and panels 30 therebetween).

System 10 of FIG. 11 also includes a vertical rail 18V that connects from rail 18 to rail 18' via one or more angled splice members 28 positioned in channel 25 of rail 18, and one or more members 28 positioned in channel 27 of rail 18', and also having the one or more members positioned in respective channels 21, 23, 25 and/or 27 of rail 18V.

It is noted that system 10 of FIG. 11 can include any number of vertical rails 18V between lower rails 18, 18B, etc. and upper rails 18, 18B', etc.

Figure 20:
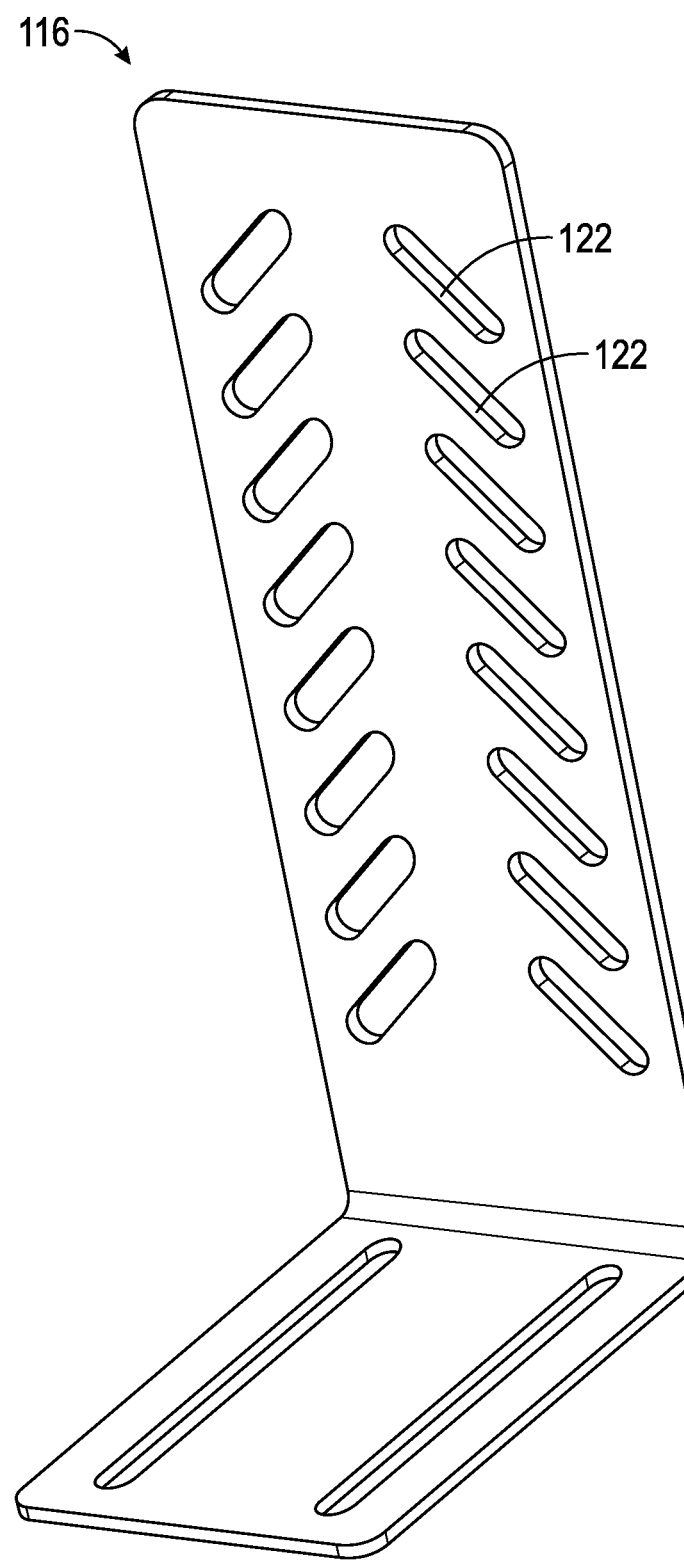
FIG. 20 is a front perspective view of another exemplary cabinet bracket.

FIG. 20 depicts a cabinet bracket 116 that may not mount to supports 40.

Cabinet bracket 116 can be mounted to a respective rail member 18 (or 18A, etc.) via fasteners inserted through slots 122 of bracket 16 and into first and second passages 19, 20 of rail 18, or into third and fourth passages 33, 35 of rail 18.

Figure 21:
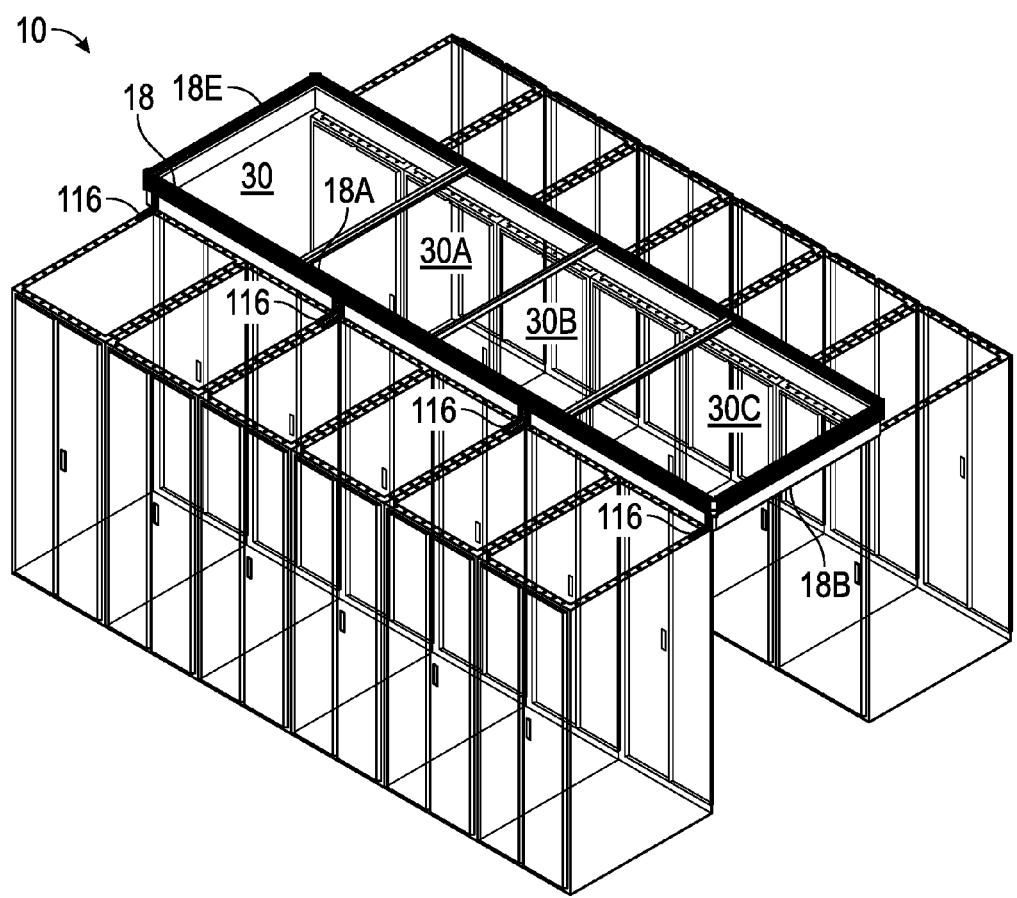
FIGS. 21-22 are side perspective views of other exemplary containment systems of the present disclosure.

FIG. 21 depicts a system 10 similar to system 10 of FIG. 1, but with the cabinet brackets 16 of FIG. 1 replaced with the brackets 116.

Figure 22:
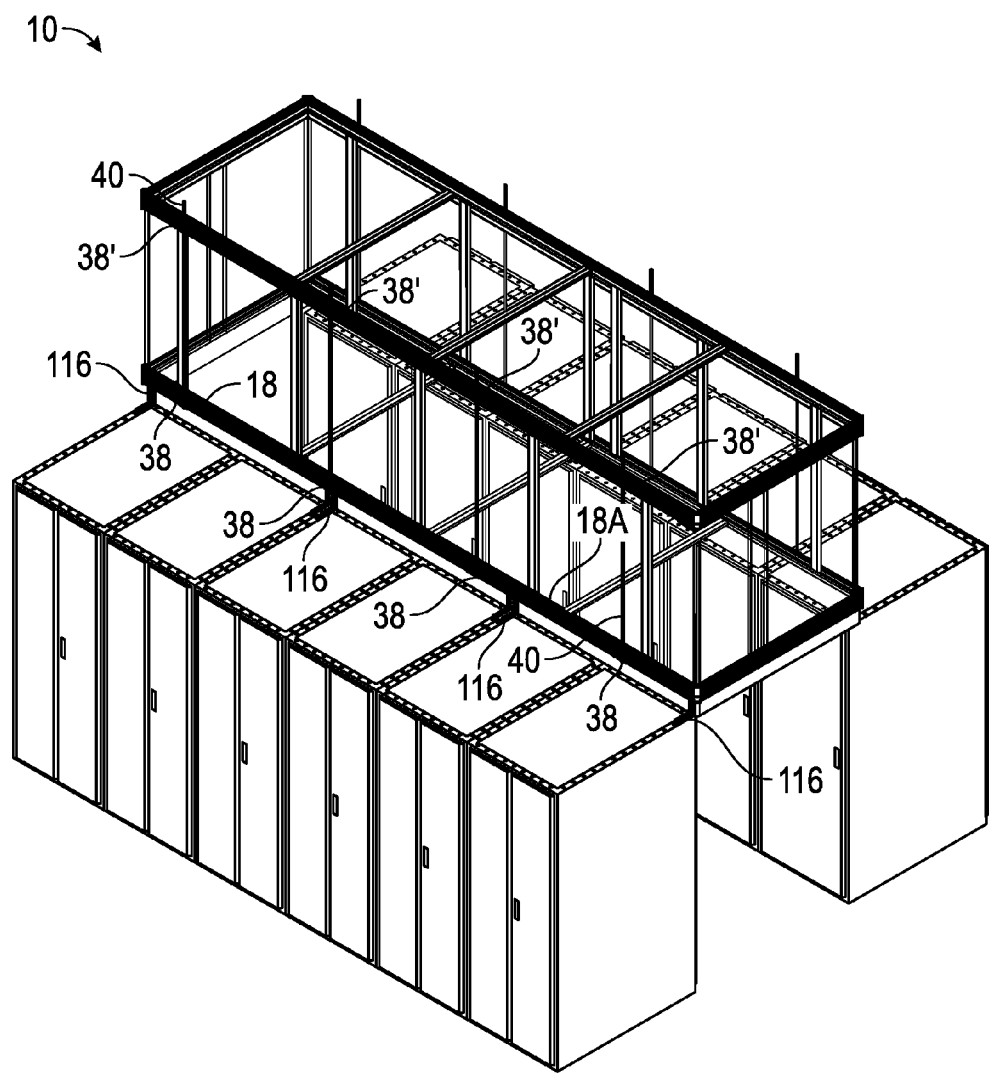

FIG. 22 depicts a system 10 similar to system 10 of FIG. 8, but with the cabinet brackets 16 of FIG. 8 replaced with the brackets 116.

In exemplary embodiments, rails 18 can be plastic or aluminum. Panel 30 can be a twin wall polycarbonate. The panel-splice 34 and cabinet seal 36 can be an extruded elastomer. Other components of system 10 can be molded plastic.

Some advantages of the exemplary system 10 include system 10 being light-weight. The installer usually has to be on a ladder for installation. The light weight system 10 lowers the risk of accident and can require only a single installer.

Other advantages include that certain components of system 10 snap together for an air tight fit allowing the system 10 the minimal amount of leakage under nominal pressures or vacuums from within the aisle. The ability for the pieces to snap together provides ease of install and a labor savings.

The modular system 10 also allows the end user to order components that can be customized on site without deploying a field engineer first to take measurements or create a custom product.

As noted, the system 10 is light-weight and requires fewer threaded rods 40 for support. It is noted that the system 10 can be mounted to a wire mesh tray or the like.

Other advantages of system 10' include: the shape of the rail 18; the ability to be supported by a cable tray; the snap together feature set; the ability of the panel joiner 34 to adjust; the ability to snap components together to fill gaps or overcome obstructions; modularity-ability to create assemblies/systems 10 on site; the same rail 18 is used for horizontal and vertical containment and in the same orientation; and/or the panel joiner 34 can act as a corner or seal when items penetrate the wall.

In other embodiments and as noted, joiner 34 may not flex, and may not be utilized as a corner.

The extruded rail 18 can be fabricated from plastic or aluminum. The extruded rail 18 profile contains at least four areas/channels (e.g., 21, 23, 25, 27) where it can accept containment panels 30. Some advantageous features of the rail 18 are as follows.

For example, the rail 18 can be installed in one orientation and be used for horizontal or vertical containment. The rail 18 provides the ability to portion the aisles between vertical and horizontal. The horizontal portion performs a blanking function where the vertical portion provides a duct for heat removal or cold air into the aisle from overhead methods.

The rail 18 can accept a panel 30 in the horizontal orientation, panels 30 can be slid in from the end point before the next rail 18 is spliced on. This allows the system 10 to be completed as one builds out the aisle.

The rails 18 can be joined together by a splice joiner 24 that snaps into place saving time and labor. The install is tool-less, but two screw locations are provided if the end user wants to secure the splice 24 to the rails 18. This also allows the rail 18 to be cut at any length and joined to any rail 18 allowing for custom fits with custom parts.

The profile of the rail 18 allows for members 28 and corners 26 to snap in.

The profile of the rail 18 allows for the containment panels 30 to be held in place with a spring clip 32. The tool-less installation is unique and design of the spring clip 32 advantageously allows for ease of installation and removal of panels 30.

Moreover, the rails 18 have the ability to have peripheral products snapped on to it via a feature set on the side of the rail 18. Some features include the following.

A hanger bracket 38 can be snapped onto the rail 18 once the threaded rod 40 is already in place.

The outside face of the bracket 38 has slots 83 that allows the bracket 38 to snap on to a wire basket or the like (e.g., Cablofil wire basket). This allows the system 10 to be supported by a wire basket or the like, and can eliminate the need to be supported by threaded rods 40 or bracketry supported by the cabinets. This feature can be used for horizontal or vertical containment applications.

It is also noted that lighting or fire suppression can be mounted to cross aisle members 18 (or other rails 18).

An exemplary containment system 10 includes components that snap together providing a savings in time and labor. Some snap together features are as follows.

The panel retention clip 32 can be open ended for ease of install and to maintain a consistent pressure allowing for a tool-less install of containment panels 30. The members 28 and corners 26 can snap into the rail 18 geometry forming an airtight corner while providing a time and labor savings. The rails 18 can be spliced together with a snap in joint splice 24 allowing for modularity in length of height of the containment system 10.

The hanger bracket 38 snaps onto the rail 18 over the threaded rod 40 allowing for the user to install the threaded rod 40 before containment installation. The ability of the bracket 38 to be placed anywhere along the rail 18 also allows for the threaded rod 40 to be deployed before installation. All joints are covered, eliminating leakage points.

The extruded panel joiner 34 fits between adjacent containment panels 30. The joiner 34 can have a wave feature that will allow it act as an accordion type feature. The feature can: allow the extrusion 34 to expand and compress to allow panels 30 to fill the aisle length without cutting; provide air tight seals between panels 30; be used to create a corner by joining panels 30; be used to fill gaps in the panels 30 where utilities or cable enter/exit the panels 30; and seal to the bottom of the channel of the rail 18.

As noted certain components of system 10 has the ability to snap components together to fill gaps or overcome obstructions. Certain components of system 10 can be snapped together to: fill gaps in the aisle created by missing cabinets 14; contain around building support columns; create panels that adapt to rows of cabinets that are not planar; and create frames for cable ladder or a wire mesh basket to penetrate the containment panels.

The panel joiner 34 can act as a corner or seal when items penetrate the wall. The panel joiner 34 can be used to join to panels 30 that are at 90 degrees. The system 10 provides a seamless corner that prevents leakage in the vertical application. The ability of the joiner 34 to expand provides a wide range of where the vertical containment panels 30 can end.

Containment system 10 is lightweight and easy to install. The parts easily snap together saving time and money. The system 10 can avoid the expense of an initial visit from a field engineer to take measurements and can eliminate the need for custom design and manufactured solutions.

It is noted that cross-aisle supports 18 can allow for additional support locations, mitigate serpentining, and/or provide additional panel support in the horizontal orientation.

It is also noted that in some embodiments the system 10 has the ability to do more than 90° angles, it can do angles in between as well as compounding (e.g., raise at an angle and angle inward).

It is also noted that the system 10 can have multi-tiers. The system 10 can have more than one upper and one lower rails 18, it can have one upper, one lower and several middle runs. System 10 can also provide cable pathways integration. For example, the pathways can be: inside aisle; outside aisle; penetrate aisle; as well as be ducked under or boxed around.

System 10 can also provide a wiper seal 74 (e.g., soft contact to expensive IT equipment racks; air seal with non-conforming, irregular and unknown surfaces; allow for +/− 3″ overhead infrastructure fluctuations based on building constraints, weather, and other conditions).

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A containment system comprising:
    a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall;
    wherein at least a first portion of the first, second and third walls define a first channel of the first rail member;
    wherein at least a second portion of the first, second and third walls define a second channel of the first rail member;

wherein at least a portion of the second, fourth and fifth walls define a third channel of the first rail member;

wherein at least a portion of the third, sixth and seventh walls define a fourth channel of the first rail member;

wherein the first rail member is configured to be mounted proximal to a first supporting structure of a data center;

wherein the first, second, third and fourth channels of the first rail member are each individually configured to releasably house a portion of a respective panel member, each individually housed panel member configured to extend from the first rail member;

wherein the fifth wall includes a first extension wall, and a first passage is defined between the second wall and the first extension wall;

wherein the seventh wall includes a second extension wall, and a second passage is defined between the third wall and the second extension wall; and wherein the first rail member is mounted with respect to the first supporting structure via a cabinet bracket, the cabinet bracket mounted to the first supporting structure and mounted to the first and second passages of the first rail member.

2. The system of claim 1, wherein the first supporting structure is a cabinet or equipment rack.

3. A containment system comprising:

a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall;

wherein at least a first portion of the first, second and third walls define a first channel of the first rail member;

wherein at least a second portion of the first, second and third walls define a second channel of the first rail member;

wherein at least a portion of the second, fourth and fifth walls define a third channel of the first rail member;

wherein at least a portion of the third, sixth and seventh walls define a fourth channel of the first rail member;

wherein the first rail member is configured to be mounted proximal to a first supporting structure of a data center;

wherein the first, second, third and fourth channels of the first rail member are each individually configured to releasably house a portion of a respective panel member, each individually housed panel member configured to extend from the first rail member;

wherein the fifth wall includes a first extension wall, the first extension wall defining a first recess;

wherein the seventh wall includes a second extension wall, the second extension wall defining a second recess; and wherein the first rail member is mounted proximal to the first supporting structure via a hanger bracket, the hanger bracket mounted to a support member and mounted to the first and second recesses of the first rail member.

4. The system of claim 1, wherein the first supporting structure is aligned in a first row of supporting structures.

5. The system of claim 1, wherein the first, second, third and fourth channels each define a substantially U-shaped or C-shaped channel.

6. The system of claim 1 further comprising a second rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall;

wherein at least a first portion of the first, second and third walls define a first channel of the second rail member;

wherein at least a second portion of the first, second and third walls define a second channel of the second rail member;

wherein at least a portion of the second, fourth and fifth walls define a third channel of the second rail member; and wherein at least a portion of the third, sixth and seventh walls define a fourth channel of the second rail member; and wherein the first, second, third and fourth channels of the second rail member are each individually configured to releasably house a portion of a respective panel member.

7. The system of claim 6, wherein the second rail member is configured to be mounted proximal to a second supporting structure of the data center; and further comprising a first panel member housed in the second channel of the first rail member and housed in the first channel of the second rail member, the first panel member extending horizontally from the first rail member to the second rail member.

8. The system of claim 7, wherein the second supporting structure is aligned in a second row of supporting structures.

9. The system of claim 6 further comprising a first panel member housed in the third channel of the first rail member and housed in the fourth channel of the second rail member, the first panel member extending vertically from the first rail member to the second rail member.

10. The system of claim 7 further comprising a second panel member housed in the second channel of the first rail member and housed in the first channel of the second rail member, the second panel member extending horizontally from the first rail member to the second rail member, with the first panel member connected to the second panel member via a panel joiner.

11. The system of claim 6, wherein the second rail member is transversely mounted to the first rail member via an angled splice member, a first portion of the angled splice member positioned in the second channel of the first rail member, and a second portion of the angled splice member positioned in the first channel of the second rail member.

12. The system of claim 11 further comprising a corner splice member mounted to the first and second rail members, a first portion of the corner splice member positioned in the first channel of the first rail member, and a second portion of the corner splice member positioned in the second channel of the second rail member.

13. The system claim 6, wherein the second rail member is linearly mounted to the first rail member via a splice member, a first portion of the splice member positioned in the first channel of the first rail member, and a second portion of the splice member positioned in the first channel of the second rail member.

14. The system of claim 1 further comprising a cabinet seal or a bulb seal mounted with respect to the fourth channel of the first rail member, the cabinet or bulb seal extending from the fourth channel to the first supporting structure.

15. The system of claim 7, wherein the first panel member is mounted in the second channel of the first rail member via a first plurality of clip members, and the first panel member is mounted in the first channel of the second rail member via a second plurality of clip members.

16. The system of claim 13, wherein the first channel of the first rail member includes a first groove and a second groove;
   wherein the first portion of the splice member includes a first protruding section and a second protruding section; and
   wherein the splice member is mounted to the first channel of the first rail member via the first protruding section positioned in the first groove and the second protruding section positioned in the second groove.

17. The system of claim 13, wherein the splice member includes a base wall, a first arm wall and a second arm wall, the base wall and first and second arm walls defining a substantially U-shaped or C-shaped splice member.

18. A containment system comprising:
   a first rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the first rail member, and at least a second portion of the first, second and third walls defining a second channel of the first rail member, and at least a portion of the second, fourth and fifth walls defining a third channel of the first rail member, and at least a portion of the third, sixth and seventh walls defining a fourth channel of the first rail member, with the first, second, third and fourth channels of the first rail member each individually configured to releasably house a portion of a respective panel member;
   a second rail member having a first wall, a second wall, a third wall, a fourth wall, a fifth wall, a sixth wall and a seventh wall, with the second and third walls connected to and oriented transverse to the first wall, the fourth and fifth walls extending transversely from the second wall, and the sixth and seventh walls extending transversely from the third wall, at least a first portion of the first, second and third walls defining a first channel of the second rail member, and at least a second portion of the first, second and third walls defining a second channel of the second rail member, and at least a portion of the second, fourth and fifth walls defining a third channel of the second rail member, and at least a portion of the third, sixth and seventh walls defining a fourth channel of the second rail member, with the first, second, third and fourth channels of the second rail member each individually configured to releasably house a portion of a respective panel member;
   a first supporting structure of a data center, the first rail member configured to be mounted proximal to the first supporting structure of the data center;
   a second supporting structure of the data center, the second rail member configured to be mounted proximal to the second supporting structure of the data center; and
   a first panel member housed in the second channel of the first rail member and housed in the first channel of the second rail member, the first panel member extending horizontally from the first rail member to the second rail member;
   wherein the first supporting structure is aligned in a first row of supporting structures;
   wherein the second supporting structure is aligned in a second row of supporting structures;
   wherein the fifth wall of the first rail member includes a first extension wall, and a first passage is defined between the second wall of the first rail member and the first extension wall;
   wherein the seventh wall of the first rail member includes a second extension wall, and a second passage is defined between the third wall of the first rail member and the second extension wall; and
   wherein the first rail member is mounted with respect to the first supporting structure via a cabinet bracket, the cabinet bracket mounted to the first supporting structure and mounted to the first and second passages of the first rail member.

* * * * *